(12) United States Patent
Koelmel et al.

(10) Patent No.: US 8,548,311 B2
(45) Date of Patent: Oct. 1, 2013

(54) APPARATUS AND METHOD FOR IMPROVED CONTROL OF HEATING AND COOLING OF SUBSTRATES

(75) Inventors: Blake R. Koelmel, Mountain View, CA (US); Norman L. Tam, San Jose, CA (US); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 859 days.

(21) Appl. No.: 12/576,711

(22) Filed: Oct. 9, 2009

(65) Prior Publication Data

US 2010/0074604 A1  Mar. 25, 2010

Related U.S. Application Data

(63) Continuation-in-part of application No. 12/483,770, filed on Jun. 12, 2009, now Pat. No. 8,367,983, which is a continuation-in-part of application No. 12/100,179, filed on Apr. 9, 2008, now Pat. No. 8,283,607.

(51) Int. Cl.
*F21V 9/00* (2006.01)
*F26B 19/00* (2006.01)

(52) U.S. Cl.
USPC .................. 392/408; 392/407; 392/418

(58) Field of Classification Search
None
See application file for complete search history.

(56) References Cited

U.S. PATENT DOCUMENTS

| | | | |
|---|---|---|---|
| 4,839,449 A | 6/1989 | Billmers et al. |
| 5,226,732 A | 7/1993 | Nakos et al. |
| 5,658,612 A | 8/1997 | Li et al. |
| 5,843,518 A | 12/1998 | Li et al. |
| 5,848,842 A | 12/1998 | Peuse et al. |
| 5,960,158 A | 9/1999 | Gat et al. |
| 6,179,466 B1 | 1/2001 | Peuse et al. |
| 6,395,363 B1 | 5/2002 | Ballance et al. |
| 6,803,588 B2 | 10/2004 | Kamieniecki |
| 6,835,914 B2 | 12/2004 | Timans |
| 6,839,507 B2 | 1/2005 | Adams et al. |
| 6,965,092 B2 | 11/2005 | Mahawili |
| 7,041,931 B2 | 5/2006 | Jennings et al. |
| 7,056,389 B2 | 6/2006 | Hauf et al. |
| 7,115,837 B2 | 10/2006 | Timans et al. |
| 7,135,656 B2 | 11/2006 | Timans et al. |
| 2005/0062388 A1 | 3/2005 | Camm et al. |
| 2006/0160352 A1 | 7/2006 | Matsushita et al. |
| 2006/0289434 A1 | 12/2006 | Timans |
| 2007/0252500 A1 | 11/2007 | Ranish et al. |
| 2008/0171417 A1 | 7/2008 | Ramachandran et al. |

OTHER PUBLICATIONS

International Search Report and Written Opinion in S/N PCT/US2010/051893, mailed May 23, 2011, 10 pgs.
Non-Final Office Action in U.S. Appl. No. 12/100,179, mailed Sep. 6, 2011, 14 pgs.

(Continued)

*Primary Examiner* — Thor Campbell
(74) *Attorney, Agent, or Firm* — Servilla Whitney LLC

(57) ABSTRACT

Methods and apparatus for processing substrates and controlling the heating and cooling of substrates are described. A radiation source providing radiation in a first range of wavelengths heats the substrate within a predetermined temperature range, the substrate being absorptive of radiation in a second range of wavelengths within the first range of wavelengths and within the predetermined temperature range. A filter prevents at least a portion of radiation within the second wavelength range from reaching the substrate.

11 Claims, 19 Drawing Sheets

(56) References Cited

OTHER PUBLICATIONS

Non-Final Office Action in U.S. Appl. No. 12/483,770, mailed Sep. 6, 2011, 12 pgs.
"Final Office Action in U.S. Appl. No. 12/100,179, dated Feb. 16, 2012", 13 pgs.
"Final Office Action in U.S. Appl. 12/483,770, dated Feb. 17, 2012", 12 pgs.
Supplementary EP Search Report in EP 09 73 0361, dated Jun. 6, 2011, 5 pgs.
"PCT International Search Report mailed Oct. 26, 2009 for PCT/US2009/039443" 7 pgs.
"PCT International Written Opinion mailed Oct. 26, 2009 for PCT/US2009/039443" 9 pgs.
Non-Final Office Action in U.S. Appl. No. 12/483,770, dated Jun. 14, 2012, 7 pgs.

APPARATUS AND METHOD FOR IMPROVED CONTROL OF HEATING AND COOLING OF SUBSTRATES

CROSS-REFERENCE TO RELATED APPLICATIONS

This application is a continuation-in-part of U.S. patent application Ser. No. 12/483,770, filed on Jun. 12, 2009, which is a continuation-in-part of U.S. patent application Ser. No. 12/100,179 filed on Apr. 9, 2008, the entire content of both applications incorporated herein by reference.

TECHNICAL FIELD

This invention relates generally to thermal processing of substrates. In particular, specific embodiments of the invention relate to pyrometry during rapid thermal processing of a semiconductor.

BACKGROUND

Rapid thermal processing (RTP) is a well-developed technology for fabricating semiconductor integrated circuits in which the substrate, for example, a silicon wafer, is irradiated with high-intensity optical radiation in a RTP chamber to quickly heat the substrate to a relatively high temperature to thermally activate a process in the substrate. Once the substrate has been thermally processed, the radiant energy is removed and the substrate quickly cools. As such, RTP is energy efficient because the chamber surrounding the substrate is not heated to the elevated temperatures required to process the substrate, and only the substrate is heated. In other words, during RTP, the processed substrate is not in thermal equilibrium with the surrounding environment, namely the chamber.

The fabrication of integrated circuits from silicon or other wafers involves many steps of depositing layers, photo lithographically patterning the layers, and etching the patterned layers. Ion implantation is used to dope active regions in the semiconductive silicon. The fabrication sequence also includes thermal annealing of the wafers for many uses including curing implant damage and activating the dopants, crystallization, thermal oxidation and nitridation, silicidation, chemical vapor deposition, vapor phase doping, thermal cleaning, among others.

Although annealing in early stages of silicon technology typically involved heating multiple wafers for long periods in an annealing oven, RTP has been increasingly used to satisfy the ever more stringent requirements for processing substrates with increasingly smaller circuit features. RTP is typically performed in single-wafer chambers by irradiating a wafer with light from an array of high-intensity lamps directed at the front face of the wafer on which the integrated circuits are being formed. The radiation is at least partially absorbed by the wafer and quickly heats it to a desired high temperature, for example above 600° C., or in some applications above 1000° C. The radiant heating can be quickly turned on and off to controllably heat the wafer over a relatively short period, for example, of one minute or, for example, 30 seconds, more specifically, 10 seconds, and even more specifically, one second. Temperature changes in rapid thermal processing chambers are capable of occurring at rates of at least about 1° C. per second to 50° C. per second and higher, for example at least about 100° C. per second or at least about 150° C. per second.

During certain processes, lower temperatures, for example, less than about 600° C., may be required. A temperature of a substrate in a processing chamber may be below 400° C. and may be as low as about 175° C. An example of such processes is forming silicides on silicon wafers. The quality and performance of processing a substrate such as a silicon wafer in a chamber depends in part on the ability to provide and maintain an accurate temperature control of the wafer or substrate. In addition, any improvement in the cool down rate of the substrate would be a major advance in rapid thermal processing of substrates. Accordingly, systems and methods to provide better control over the heating of substrates and/or to improve the cool down rate substrates in thermal processing chambers are desired.

SUMMARY

In one embodiment, an apparatus for heating a substrate comprises a heat source to provide radiation in a first range of wavelengths and to heat the substrate within a predetermined temperature range, the substrate being absorptive of radiation in a second range of wavelengths within the first range of wavelengths and within the predetermined temperature range; a process area including a substrate support to support the substrate; and a filter disposed between the substrate support and the heat source to filter radiation from the heat source so that at least a portion of the radiation within the second range of wavelengths is not absorbed by the substrate.

In one embodiment, the filter comprises a reflective window effective to prevent at least a portion of the radiation within the second range of wavelengths from being transmitted to the substrate when the heating source is turned off after heating the substrate to a temperature of less than about 600° C. so that the substrate cooling occurs at a faster rate than when the radiation within the second range of wavelengths is not prevented from being absorbed by the substrate. In one embodiment, the filter comprises a reflective window that reflects radiation within the second range of wavelengths and the second range of wavelengths is a predetermined range of wavelengths based on the substrate's absorbance as a function of temperature.

In a specific embodiment, the substrate comprises silicon and the second range of wavelengths has lower limit greater than about 1000 nm. In further specific embodiments, the second range of wavelengths has a lower limit of about 1000 nm and an upper limit of about 1300 nm, or a lower limit of about 1000 nm and an upper limit of about 1200 nm.

In one embodiment, the filter comprises an absorptive window effective to prevent at least a portion of the radiation within the second range of wavelengths from being transmitted to the substrate when the heating source is turned off after heating the substrate to a temperature of less than about 600° C. In one embodiment, the substrate comprises silicon and the second range of wavelengths has a lower limit that exceeds about 900 nm.

In a specific embodiment, the heating source comprises lamps and the second range of wavelengths is selected based upon composition of the substrate and peak emission of the heating source as a function of applied energy to the lamps to provide improved predictability of heating of the substrate as a function of energy applied to the lamps.

In specific embodiments that utilize a reflective window, the reflective window is effective to block a preselected percentage of radiation within the second range of wavelengths and a different preselected percentage of radiation within a third range of wavelengths different from the second range of wavelengths.

In other specific embodiments, the apparatus further comprises a processor operative to control quantity of energy and time interval of energy supplied to the lamps to generate a predetermined maximum heating element temperature to provide an optimized cool down profile for the lamp to reduce thermal exposure of a substrate in the process area.

In specific method embodiments, filtering of radiation from the heating source is provided by a reflective window effective to prevent at least a portion of the radiation within the second range of wavelengths from being transmitted to the substrate when the heating source is turned off after heating the substrate to a temperature of less than about 600° C. and so that the substrate cooling occurs at a faster rate than when the radiation within the second range of wavelengths is not prevented from being absorbed by the substrate. In one method embodiment, the second range of wavelengths is a predetermined range of wavelengths based on the substrate's absorbance as a function of temperature.

In specific method embodiments, filtering of radiation from the heating source is provided by a reflective window effective to prevent at least a portion of the radiation within the second range of wavelengths from being transmitted to the substrate when the heating source is turned off after heating the substrate to a temperature of less than about 600° C. and the substrate cooling occurs at a faster rate than when the radiation within the second range of wavelengths is not prevented from being absorbed by the substrate. In one method embodiment, the second range of wavelengths is a predetermined range of wavelengths based on the substrate's absorbance as a function of temperature.

In specific method embodiments, the substrate comprises silicon and the second range of wavelengths has a lower limit that exceeds about 1000 nm, for example, a lower limit of about 1000 nm and an upper limit of about 1300 nm, or more specifically a lower limit of about 1000 nm and an upper limit of about 1200 nm.

In a specific method embodiment, filtering of radiation from the heating source is provided by an absorptive window effective to prevent at least a portion of the radiation within the second range of wavelengths from being transmitted to the substrate when the heating source is turned off after heating the substrate to a temperature of less than about 600° C.

In other specific method embodiments, the window further includes an absorber effective to block at least a portion of the radiation within the second wavelength range from reaching the substrate when the heating source is turned off after heating the substrate to a temperature of less than about 600° C. In other method embodiments, the window further includes an absorber effective to block at least a portion of radiation above a predetermined wavelength from reaching the substrate when the heating source is turned off after heating the substrate to a temperature of less than about 600° C.

In other method embodiments, the substrate comprises silicon and the second range of wavelengths has a lower limit that exceeds about 900 nm.

In one method embodiment, the heating source comprises lamps and the second range of wavelengths is selected based upon composition of the substrate and peak emission of the heating source as a function of applied energy to the lamps to provide improved predictability of heating of the substrate as a function of energy applied to the lamps compared to when the filtering is not performed. The method may further comprise controlling quantity of energy and time interval of energy supplied to the lamps to generate a predetermined maximum heating element temperature to provide an optimized cool down profile for the lamp to reduce thermal exposure of a substrate in the chamber.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

According to one or more embodiments of the invention, a thermal processing chamber for processing a substrate such as a semiconductor wafer is provided. Wafer temperature is measured by radiation pyrometry. Wafer temperature can be determined through radiation pyrometry by determining the emissivity of the substrate and applying known radiation laws to calibrate a pyrometer for accurate temperature measurements. Radiation within the bandwidth or wavelength range of the pyrometer which originates from the heating source (e.g., the lamps) interferes with the interpretation of the pyrometer signal if this radiation is detected by the pyrometer. This may be due to leakage of source radiation in the chamber that reaches the pyrometer, or source radiation that reaches the pyrometer when the wafer is "transparent" to source radiation. This may occur, for example with silicon wafers during operation of the chamber at temperatures below 450° C., and as low as 25° C.

Figure 1:
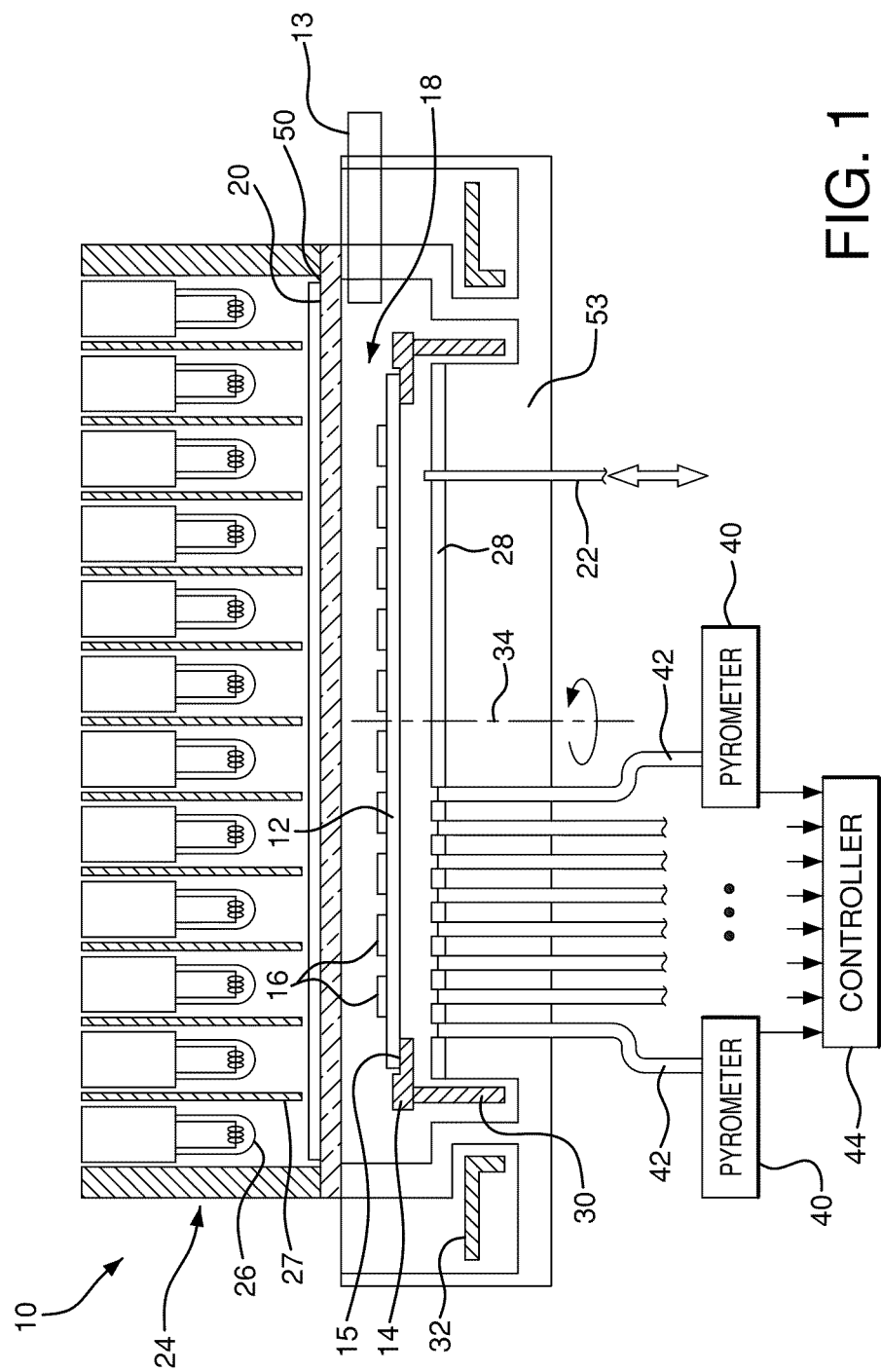
FIG. 1 shows a cross-sectional view of a rapid thermal processing chamber according to one or more embodiments.

FIG. 1 schematically represents a rapid thermal processing chamber 10. Peuse et al. describe further details of this type of reactor and its instrumentation in U.S. Pat. Nos. 5,848,842 and 6,179,466. A wafer 12, for example, a semiconductor wafer such as a silicon wafer to be thermally processed is passed through the valve or access port 13 into the process area 18 of the chamber 10. The wafer 12 is supported on its periphery by a substrate support shown in this embodiment as an annular edge ring 14 having an annular sloping shelf 15 contacting the corner of the wafer 12. Ballance et al. more completely describe the edge ring and its support function in U.S. Pat. No. 6,395,363. The wafer is oriented such that processed features 16 already formed in a front surface of the wafer 12 face upwardly, referenced to the downward gravitational field, toward a process area 18 defined on its upper side by a transparent quartz window 20. Contrary to the schematic illustration, the features 16 for the most part do not project substantial distances beyond the surface of the wafer 12 but constitute patterning within and near the plane of the surface. Three lift pins 22 may be raised and lowered to support the back side of the wafer 12 when the wafer is handed between a paddle or robot blade (not shown) bringing the wafer into the chamber and onto the edge ring 14. A radiant heating apparatus 24 is positioned above the window 20 to direct radiant energy toward the wafer 12 and thus to heat it. In the reactor or processing chamber 10, the radiant heating apparatus includes a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized.

As used herein, rapid thermal processing or RTP refers an apparatus or a process capable of uniformly heating a wafer at rates of about 50° C./second and higher, for example, at rates of 100° to 150° C./second, and 200° to 400° C./second. Typical ramp-down (cooling) rates in RTP chambers are in the range of 80-150° C./second. Some processes performed in RTP chambers require variations in temperature across the substrate of less than a few degrees Celsius. Thus, an RTP chamber must include a lamp or other suitable heating system and heating system control capable of heating at rate of up to 100° to 150° C./second, and 200° to 400° C./second distinguishing rapid thermal processing chambers from other types of thermal chambers that do not have a heating system and heating control system capable of rapidly heating at these rates.

In accordance with a further aspect of the present invention embodiments of the present invention may be applied also to flash annealing. As used herein flash annealing refers to annealing a sample in less than 5 seconds, specifically, less than 1 second, and in some embodiments, milliseconds.

It is important to control the temperature across the wafer 12 to a closely defined temperature uniform across the wafer 12. One passive means of improving the uniformity includes a reflector 28 extending parallel to and over an area greater than the wafer 12 and facing the back side of the wafer 12. The reflector 28 efficiently reflects heat radiation emitted from the wafer 12 back toward the wafer 12. The spacing between the wafer 12 and the reflector 28 can be within the range of 3 to 9 mm, and the aspect ratio of the width to the thickness of the cavity is advantageously greater than 20. In accordance with one aspect of the present invention a reflector plate is applied to enhance the apparent emissivity of a substrate such as a wafer. The reflector 28, which may be formed of a gold coating or multi-layer dielectric interference mirror, effectively forms a black-body cavity at the back of the wafer 12 that tends to distribute heat from warmer portions of the wafer 12 to cooler portions. In other embodiments, for example, as disclosed in U.S. Pat. Nos. 6,839,507 and 7,041,931, the reflector 28 may have a more irregular surface or have a black or other colored surface. The black-body cavity is filled with a distribution, usually described in terms of a Planck distribution, of radiation corresponding to the temperature of the wafer 12 while the radiation from the lamps 26 has a distribution corresponding to the much higher temperature of the lamps 26. The reflector 28 can be deposited on a water-cooled base 53 made of metal to heat sink excess radiation from the wafer, especially during cool down. Accordingly, the process area of the processing chamber has at least two substantially parallel walls, of which a first is a window 20, made of a material being transparent to radiation such as quartz, and a second wall 53 substantially parallel to the first wall which is made of metal and is significantly not transparent.

One way of improving the uniformity includes supporting the edge ring 14 on a rotatable cylinder 30 that is magnetically coupled to a rotatable flange 32 positioned outside the chamber. A rotor (not shown) rotates the flange 32 and hence rotates the wafer about its center 34, which is also the centerline of the generally symmetric chamber.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the wafer 12 through apertures in the reflector 28 to measure the temperature across a radius of the rotating wafer 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well known Planck distribution of the spectral distribution of light intensity radiating from a black-body held at that temperature. Pyrometry, however, is affected by the emissivity of the portion of the wafer 12 being scanned. Emissivity ∈ can vary between 1 for a black body to 0 for a perfect reflector and thus is an inverse measure of the reflectivity R=1−∈ of the wafer back side. While the back surface of a wafer is typically uniform so that uniform emissivity is expected, the backside composition may vary depending upon prior processing. The pyrometry can be improved by further including a emissometer to optically probe the wafer to measure the emissivity or reflectance of the portion of the wafer it is facing in the relevant wavelength range and the control algorithm within the controller 44 to include the measured emissivity.

In the embodiment shown in FIG. 1, the separation between the substrate 12 and the reflector 28 is dependent on the desired heat flow for the given substrate 12. In one embodiment, the substrate 12 can be disposed at a greater distance from the reflector 28 to decrease the heat flow to the substrate. In another embodiment, the substrate 12 can be placed closer to the reflector 28 to increase the heat flow to the substrate 12. The exact position of the substrate 12 during the heating of the substrate 12 and the residence time spent in a specific position depends on the desired amount of heat flow to the substrate 12.

In another embodiment, when the substrate 12 is in a lower position, proximate the reflector 28, the thermal conduction from the substrate 12 to the reflector 28 increases and enhances the cooling process. The increased rate of cooling in turn promotes optimal RTP performances. The closer the substrate 12 is positioned to the reflector 28; the amount of thermal exposure will proportionally decrease. The embodiment shown in FIG. 1 allows the substrate 12 support to be easily levitated at different vertical positions inside the chamber to permit control of the substrate's thermal exposure. It will be understood that the configuration shown in FIG. 1 is not intended to be limiting. In particular, the invention is not limited to configurations in which the heat source or lamps are directed at one side or surface of the substrate and the pyrometers are directed at the opposite side of the wafer.

As noted above, wafer temperature in the process area of a processing chamber is commonly measured by radiation pyrometry. While radiation pyrometry can be highly accurate, radiation which is within the radiation pyrometer bandwidth and which originates from the heating source may interfere with the interpretation of the pyrometer signal if this radiation is detected by the pyrometer. In Applied Materials' RTP systems this minimized by the process kit and by the wafer itself. The process kit couples the wafer with the rotation system. It may include a support cylinder which is shown as 30 in FIG. 1. It may also include a support ring which is not shown in the Figures but it may be used in certain processing chamber configurations). Such a support ring is basically an auxiliary edge ring which supports the edge ring, which is shown as 14 in FIG. 1.

In general, one or more pyrometers 40 as shown in FIG. 1 may be positioned in such a way that the substrate or wafer 12 shields the radiation source 26 from the pyrometer. A substrate such as a wafer is largely transparent to radiation for wavelengths greater than or about 1100 nm. Accordingly, one way to limit heat source radiation from reaching the pyrometer is to measure radiation at wavelengths at which the substrate may be substantially opaque to the wavelength. For a silicon wafer, such wavelengths may be at about 1100 nm and lower. Nevertheless, as noted above, the process kits can "leak" source radiation and not all wafers are opaque at the pyrometer bandwidth, especially when the wafer is at lower temperatures, of about 450° C. and lower. In a further embodiment the temperature may be about 400° C. and lower. In yet a further embodiment the temperature may be about 250° C. and lower. In a further embodiment the temperature may be high and may be above the melting point of the substrate such as a wafer that is being processed in the chamber.

Figure 2:
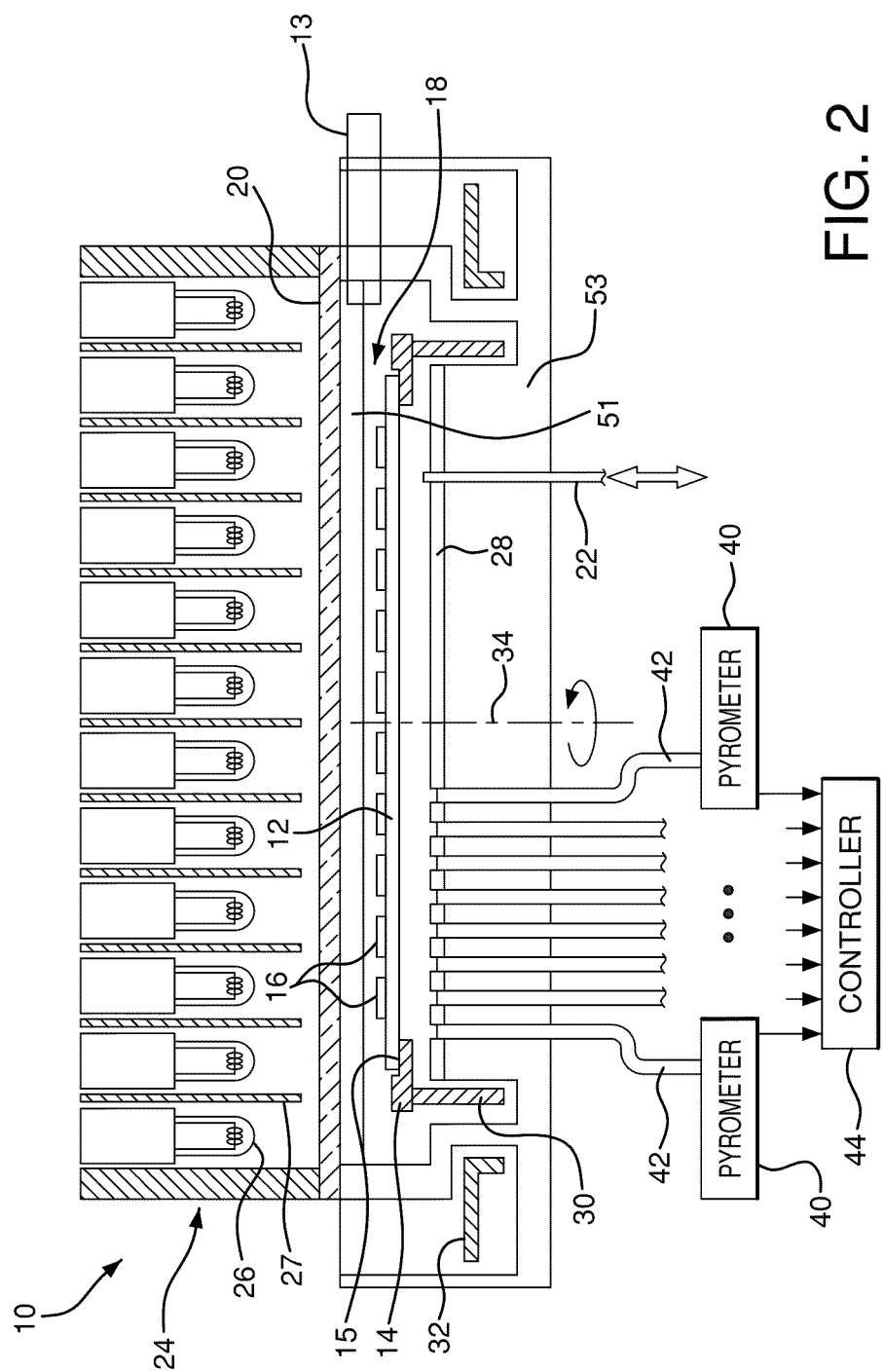
FIG. 2 shows another cross-sectional view of a rapid thermal processing chamber according to one or more embodiments.

In accordance with an embodiment of the present invention, one solution to the radiation originating from the heating source either by "leaking" or by transmitting through the substrate is to prevent the source radiation in the pyrometer bandwidth from reaching to the wafer. In accordance with a further aspect of the present invention, the radiation in the pyrometer bandwidth is reflected back to the source. This may be done by coating the window 20 in FIG. 1 that is separating the heat source from the process area 18 with a material 51 which reflects the pyrometer bandwidth radiation while permitting sufficient source radiation for heating to pass through the window 20. A film of reflective coating 50 may be placed on the side of the window facing the heat source as is shown in FIG. 1. In another embodiment, material 51 can be a reflective layer 51 placed on the side of the window 20 facing the substrate as is shown in FIG. 2. In another embodiment, a reflective layer may be applied to both sides of the window. In a specific embodiment, the entire window 20 is covered completely with a reflective layer, and there is no gap or opening in the coating. In other words, the window 20 comprising a reflective layer with no interruption in the reflective layer or the window 20 separates the substrate from the heat source. There is no transparent segment in the window 20 that disrupts or breaks the continuous reflective layer on the window 20.

By covering the window 20 with a reflective coating in a range of wavelengths at which a pyrometer is sensitive, substantially no radiation in that range of wavelengths coming directly from the heat source will reach the pyrometer. Accordingly, when the pyrometer detects radiation in the range of wavelengths, the radiation is coming only or substantially only from the substrate, even when the substrate is transparent to that range of wavelengths, for example, for a silicon wafer being processed at temperatures below about 400° C., and more specifically, below about 250° C. The use of the reflective layer improves the accuracy of the pyrometer.

Figure 3A:
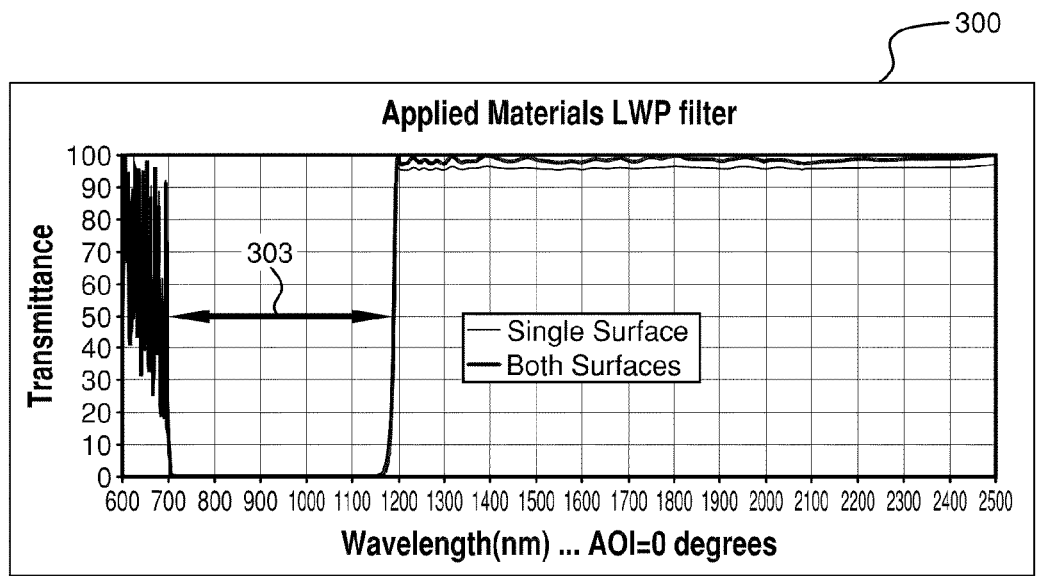
FIGS. 3A and 3B shows graphs of filter transmission versus wavelength in accordance with an aspect of the present invention.

In one embodiment, the layers may include multiple (thin) layers of optically transparent materials with different refractive indices, which are sometimes referred to as dielectric minors. The layers may be deposited on a substrate such as a window 20. A multilayer dielectric mirror may work as a reflective filter, wherein radiation is reflected. Radiation may be reflected selectively dependent among other elements on the wavelength of the radiation, the angle of incidence of the radiation, properties of the applied dielectric material including the refractive index of the applied dielectric material, the thickness of each layer, the number of layers of different thickness, and arrangement of layers. The filter properties of a multilayer dielectric minor may be illustrated by a graph as provided in graph 300 of FIG. 3A. Such a graph shows a transmittance of radiation in percentage relative to the provided radiance dependent on wavelength of radiation. As seen in FIG. 3A, within a range of about 700 nm to 1200 nm no radiation is transmitted, while for instance well above 1200 nm more than 95% of the radiation is transmitted. This filter as illustrated in FIG. 3A may be characterized as a band-stop filter or a notch filter.

In one embodiment, the layers may include multiple (thin) layers of optically transparent materials with different refractive indices, which are sometimes referred to as dielectric mirrors. The layers may be deposited on a substrate such as a window 20. A multilayer dielectric mirror may work as a reflective filter, wherein radiation is reflected. Radiation may be reflected selectively dependent among other elements on the wavelength of the radiation, the angle of incidence of the radiation, properties of the applied dielectric material including the refractive index of the applied dielectric material, the thickness of each layer, the number of layers a different thickness, and arrangement of layers. The filter properties of a multilayer dielectric mirror may be illustrated by a graph as provided in graph 300 of FIG. 3A. Such a graph shows a transmittance of radiation in percentage relative to the provided radiance dependent on wavelength of radiation. As seen in FIG. 3A, within a range of about 700 nm to 1200 nm no radiation is transmitted, while for instance well above 1200 nm more than 95% of the radiation is transmitted. This filter as illustrated in FIG. 3A may be characterized as a band-stop filter or a notch filter.

In a specific embodiment, only the window 20 as part of the process area has to be coated. Furthermore, in a specific embodiment, the window is coated completely with no openings in the layer. In one or more embodiments, the window 20 is removable. This makes servicing of the coating for repair or re-application of the film or exchange of the window with a replacement window relatively easy to do. In specific embodiments, the wall 53 is not coated.

In accordance with a further aspect of the present invention, a pyrometer will be used to measure relatively low temperatures below about 400° C. or below about 250° C. to about 175° C. by detecting radiation with the pyrometer in a range of wavelengths of about 700-1100 nm. The range of wavelengths radiated by a heat source in a processing chamber usually ranges from below 700 nm to above 5.5 micron. Materials such as quartz become opaque at wavelengths above 5.5 micron. When radiation with wavelengths between about 700-1100 nm is reflected back to the heat source sufficient radiation of other wavelengths will still be available from the source to heat the substrate to temperatures below about 400° C.

In one embodiment, the reflective layer is a broad band reflective filter. In one embodiment, it operates as a reflective filter with a maximum reflective ratio of about 100% or with a maximum reflection to transmission ratio of about not less than 1000 in a range of 700 nm-1100 nm. A relative bandwidth is defined herein as $$bw_{rel} = \frac{\lambda_{high} - \lambda_{low}}{\lambda_{center}}$$

with $\lambda_{center}$ being the wavelength at the arithmetical average of $\lambda_{high}$ and $\lambda_{low}$. Herein the $\lambda_{low}$ is determined as the wavelength where above the measured reflection is 50% of the measured incident radiation and $\lambda_{high}$ is determined as the wavelength where below the measured reflection is 50% of the measured incident radiation.

Figure 3B:
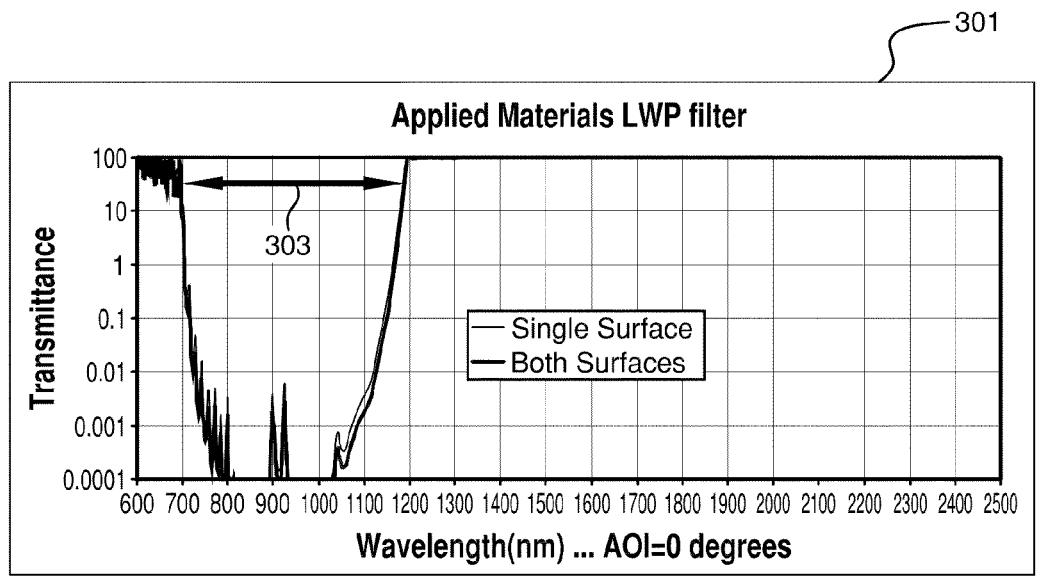

This aspect is illustrated in FIGS. 3A and 3B, which show a modeled transmittance characteristic of a filter in accordance with an aspect of the present invention. FIG. 3A shows transmittance on a linear scale as a function of wavelength. FIG. 3B shows transmittance on a logarithmic scale. Arrow 303 in both graphs identifies the 50% point for determining the relative bandwidth of this filter. The relative bandwidth of this filter is about 500 nm at the 50% point.

In one embodiment, a filter which passes most source radiation and reflects the pyrometer bandwidth radiation is placed on either the outside or inside or on both surfaces of a window separating a heating source from the process chamber. As used herein, the term "window" refers to material between the substrate and the heat source. In embodiments in which the heat source is a lamp, the term window is intended to include the lamp envelope which is typically made from quartz or any other suitable material.

Figure 4:
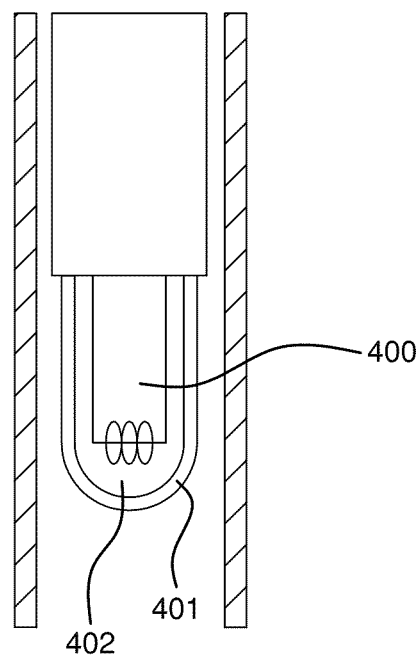
FIG. 4 shows a cross-sectional view of a heat source in accordance with an aspect of the present invention.

Thus, in a further embodiment, the filter may also be placed on the inner or outer surface of an envelope of a radiation source or on both surfaces. An illustration of this aspect is shown in FIG. 4 with a layer 401 external to an envelope 402 on a lamp 400. This has an added benefit that it may raise the efficiency of the heat source.

Thus, in a further embodiment, the filter may also be placed on the inner or outer surface of an envelope of a radiation source or on both surfaces. An illustration of this aspect is shown in FIG. 4 with a layer 401 external to an enveloped 402 on a lamp 400. This has as an added benefit that it may raise the efficiency of the heat source.

In a further embodiment, the performance of a pyrometer in a designated range of wavelengths may be improved by adding an absorber material to the reflective layer, in a layer between two reflecting layers of the film. The absorber may also be part of the substrate to which a reflective layer is applied, in the form of a dopant or added material. Thus, the substrate to which the layer is applied may be partly absorptive. The substrate to which the reflective layer is applied may also be doped with a material that enhances absorptive properties of the substrate. The substrate with the reflective layer is a window such as window 20 in FIGS. 1 and 2. In other embodiments, an absorbing fluid may be provided between a pair of window panes. The absorber does have to absorb somewhat in the pyrometer bandwidth, but can absorb in other spectral regions though not so much in the radiation source region. Since the two reflecting films, either on opposite sides of a single windows or on two separate windows in a spaced apart relationship can act as a hall of mirrors for the pyrometer bandwidth, the net effect of the absorption will be magnified. Any material absorbing radiation in the pyrometer bandwidth, to an amount of some but less than a few % over the radiation spectrum passing through quartz (~0.4 to 4 microns), will be suitable. In one embodiment, rare earth oxides are an excellent candidate for being added as an absorber material to the reflective layer or substrate. In a further embodiment, a band pass absorber (such as Si) that passes more source radiation than pyrometer radiation may be added to the layer or substrate. In yet a further embodiment, a general absorptive material may be added to the layer, for example, carbon, metals, other oxides miscible with the layer materials or window (substrate) material. Window materials may include quartz, alumina, yttria, glasses, or other substantially transparent ceramics.

Figure 5A:
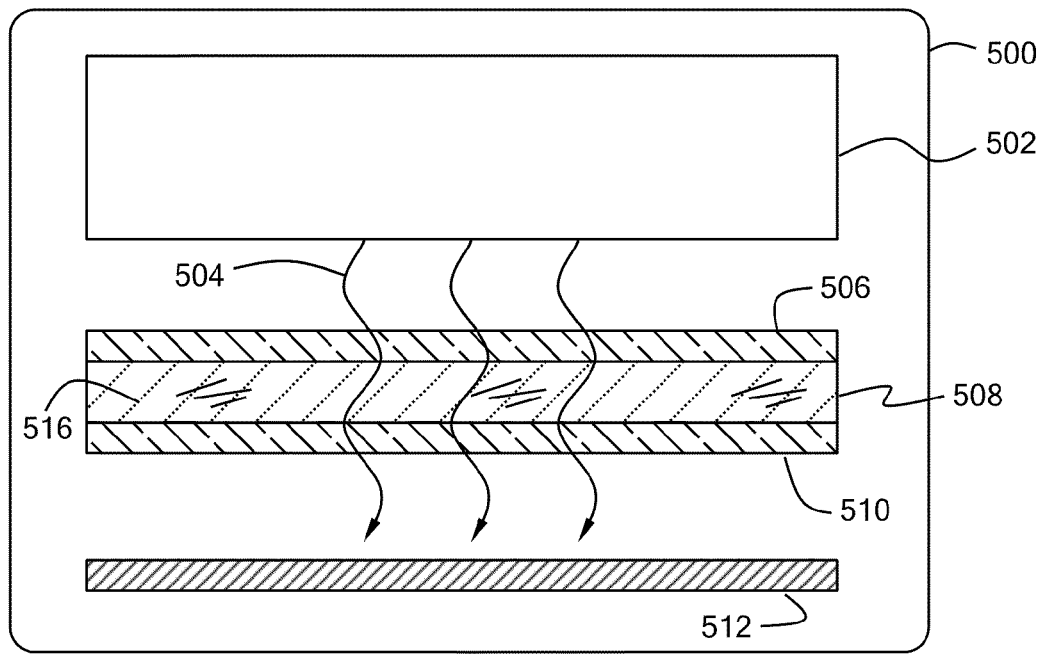
FIG. 5A is a schematic partial cross-sectional view of a processing chamber in accordance with one embodiment of the present invention.
Figure 5B:
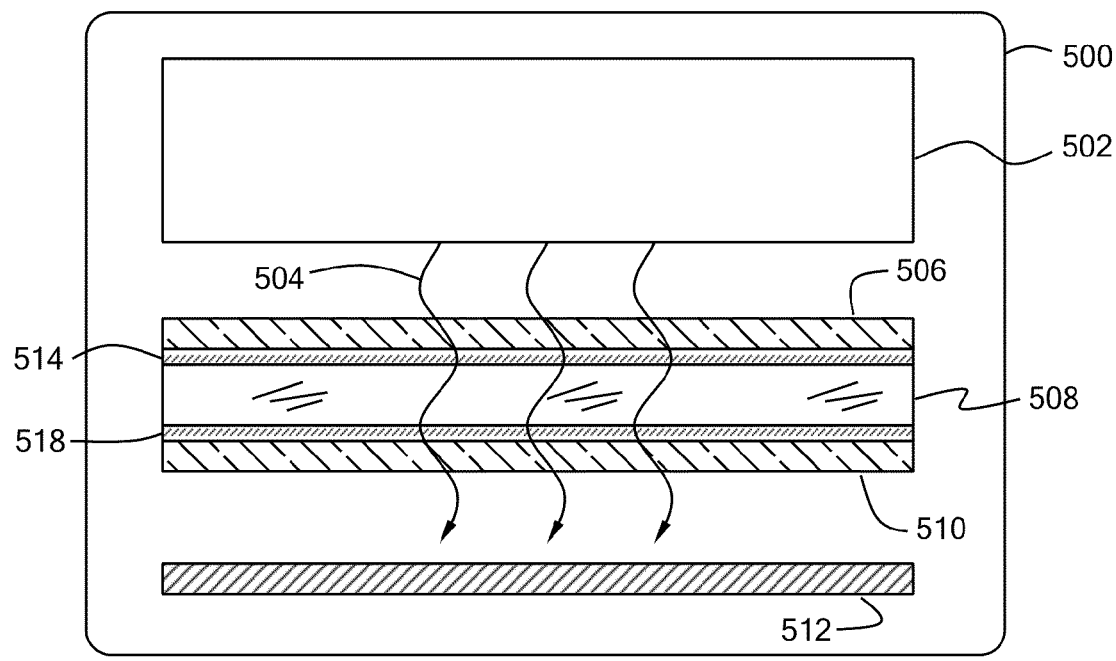
FIG. 5B is a schematic partial cross-sectional view of a processing chamber in accordance with one embodiment of the present invention.

FIGS. 5A and 5B schematically illustrate the concept of adding an absorber material to a filter. As shown in FIG. 5A, chamber 500 includes a heat source 502, which may be a lamphead, and a window 508 having a first or top surface facing the heat source 502 and a second or bottom surface facing a wafer 512 that is heated by radiation through a radiation path illustrated by arrows 504. As noted above, one or two reflective coatings, which may be dielectric multilayer filters, can be provided on the window 508, each of which reflects radiation in a band of radiation wavelengths in which a pyrometer is operational. This type of filter arrangement can be described as a "notch filter", wherein a notch indicates a reflection band. In a first embodiment, a first reflective coating in the form of a dielectric multilayer notch filter 506 can be disposed on only the top surface of the window 508. This multilayer notch filter 506 may be referred to as a "top filter stack", wherein the stack is formed by a plurality of dielectric layers. The position "top" is defined by the fact that the filter is on the window side that is the farthest away from the wafer 512. In a second embodiment, a second reflective coating in the form of a dielectric multilayer notch filter 510 is disposed on only the bottom surface of the window 508. This multilayer notch filter 510 may be referred to as a "bottom filter stack", wherein the stack is formed by a plurality of dielectric layers. The position "bottom" is defined by the fact that the filter is on the window side that is the closest to the wafer 512. In the embodiment shown in FIG. 5A, both a top filter stack 506 and a bottom filter stack 510 are applied to window 508.

As discussed above, the single dielectric multilayer filter or the dual dielectric multilayer filters are applied to prevent radiation in a selected wavelength range as generated by the heat source, from entering the processing chamber where the wafer 512 is being processed. This assures that radiation in the selected range that is detected by a pyrometer, such as a pyrometer 40 in FIG. 1, most likely is radiation generated by the wafer. This can be achieved by using either a single notch filter or dual notch filters having a reflecting notch that covers the complete reflection range.

Figure 7:
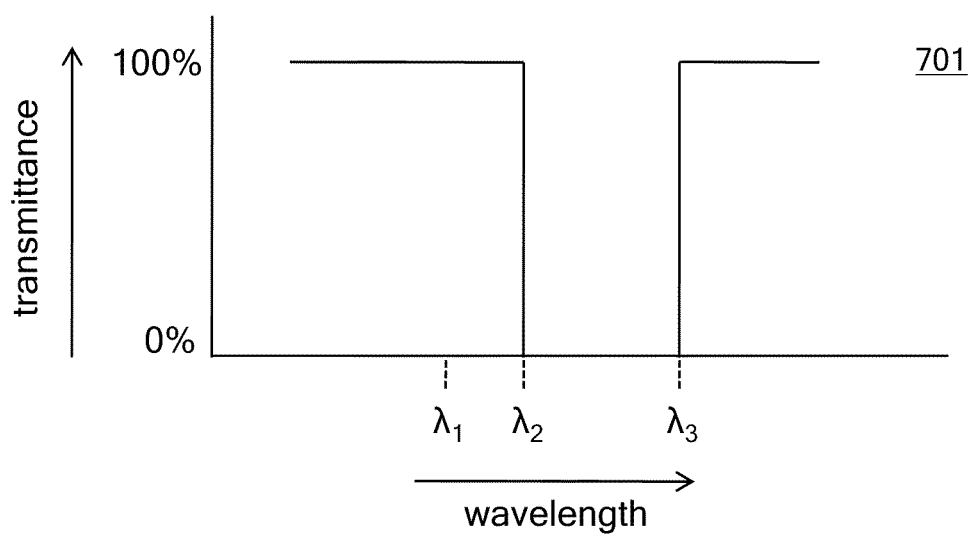
FIG. 7 shows two graphs of radiation filter characteristics in accordance with an aspect of the present invention.
Figure 7:
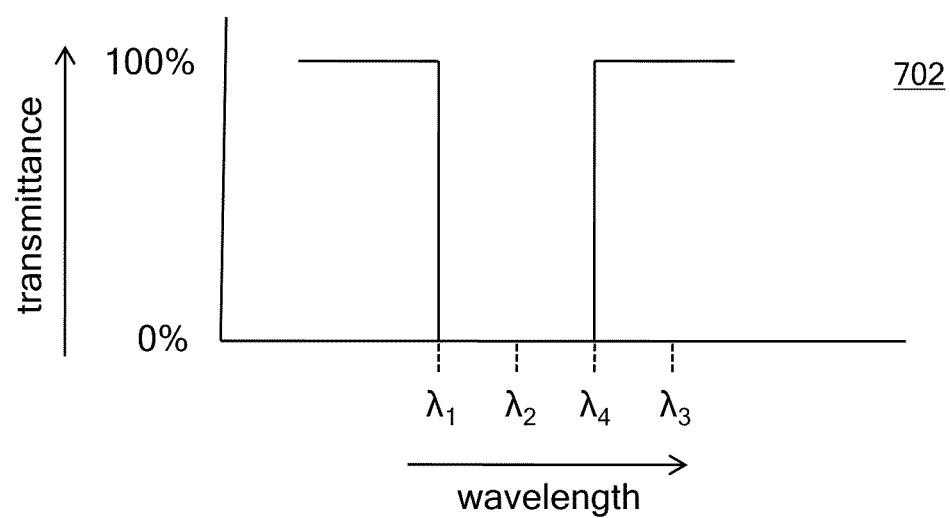

In one or more embodiment, dual filters such as top filter 506 and bottom filter 510 may have overlapping or additive reflective ranges. An example of such an overlapping arrangement is illustrated in FIG. 7, in which 701 shows an approximation of a transmittance characteristic as a function of wavelength of a first filter. This filter, as indicated by 701, completely or almost completely passes radiation in a range of wavelengths smaller than $\lambda_2$ and greater than $\lambda_3$. It completely, or almost completely, reflects radiation in a wavelength range between $\lambda_2$ and $\lambda_3$. A second filter represented by 702 reflects radiation completely or almost completely in a wavelength range between $\lambda_1$ and $\lambda_4$, wherein $\lambda_1 < \lambda_2 < \lambda_4$, $< \lambda_3$. As a consequence, the use of the two filters having characteristics as shown in 701 and 702 on top and bottom of the window will create a combined reflection of radiation in a range of $\lambda_1, \lambda_3$. Accordingly, substantially no or only a limited amount of radiation in a wavelength range of $\lambda_1, \lambda_3$ generated by the lamphead will reach the wafer, when two filters with the complementary notches are used. Using such a complementary approach may be advantageous for creating the individual filters and may provide a better overall filter characteristic.

As discussed above, if the dielectric multilayer mirrors are applied on both sides of the window, this may create a "hall of mirrors" effect. With respect to FIG. 5A, the "hall of mirrors" effect may occur for top and bottom filter 506 and 510 having the same reflective wavelength range, or when the two filters have a substantial overlap in reflective wavelength range. Minimizing overlap in reflective wavelength range if two filters 506 and 510 are used may minimize the "hall of mirrors" effect. A "hall of mirrors" effect captures radiation energy of radiation in the reflective wavelength range of the filters between the mirrors inside the window, which may be undesirable. As discussed above, a radiation absorbing material may be included in the window that at least absorbs radiation energy in the reflective wavelength range of the dielectric mirrors. A material that absorbs radiation in a broad range of wavelengths or a material that absorbs in a limited range such as the reflective wavelength range can be used. In one embodiment, in using a broad range absorbing material, enough absorbent material is used to sufficiently dampen the "hall of mirrors" effect in the reflective wavelength range, without substantially affecting the energy transfer from lamphead to processing chamber in the non-reflecting range. In yet a further embodiment, the window material, which may be quartz, can be doped with an absorbing material. This is illustrated as dashed lines 516 in FIG. 5A. To limit broadband energy loss as well as prevent the overheating of the window the concentration of absorbing material in the window can be limited to less than about 5% by weight, or in more specific embodiments, less than about 1% by weight or less.

In yet a further embodiment illustrated in FIG. 5B, one or more layers of absorbing material at least including the reflective wavelength range of the filters on one side on or both sides of the window can be provided. This is illustrated in FIG. 5B as 514 and 518. The purpose of the absorbing layer is to dampen reflected radiation. For that reason, according to one embodiment absorbing layers 514 and 518 should be located between reflective coatings 506 and 510 and the bulk of the window material. An absorbing layer may be a layer such as a film layer that is deposited on the window before the reflective dielectric layers are deposited.

In yet a further embodiment an absorbing layer may be part of a doping layer of the quartz window. Such a layer may also be a gradient layer. Accordingly, radiation in the reflective wavelength range coming from the window before it enters the dielectric stack will be attenuated before it is reflected back and will be attenuated again after reflection before it re-enters the window.

In another embodiment, a plurality of windows can be arranged in a stacked relationship between the heat source and the substrate. Thus two or more windows can be arranged, each of the windows having one or more reflective coatings. One or more of the windows 508 can have an absorber as described in FIGS. 5A and 5B above, or as described below with respect to FIG. 6. Windows of different types, for example one or more of each type of window in FIG. 5A, FIG. 5B, and/or FIG. 6 can be arranged in a stacked relationship between the heat source and the substrate. The windows can be arranged in a spaced apart relationship, or they can be abutting each other.

Figure 6:
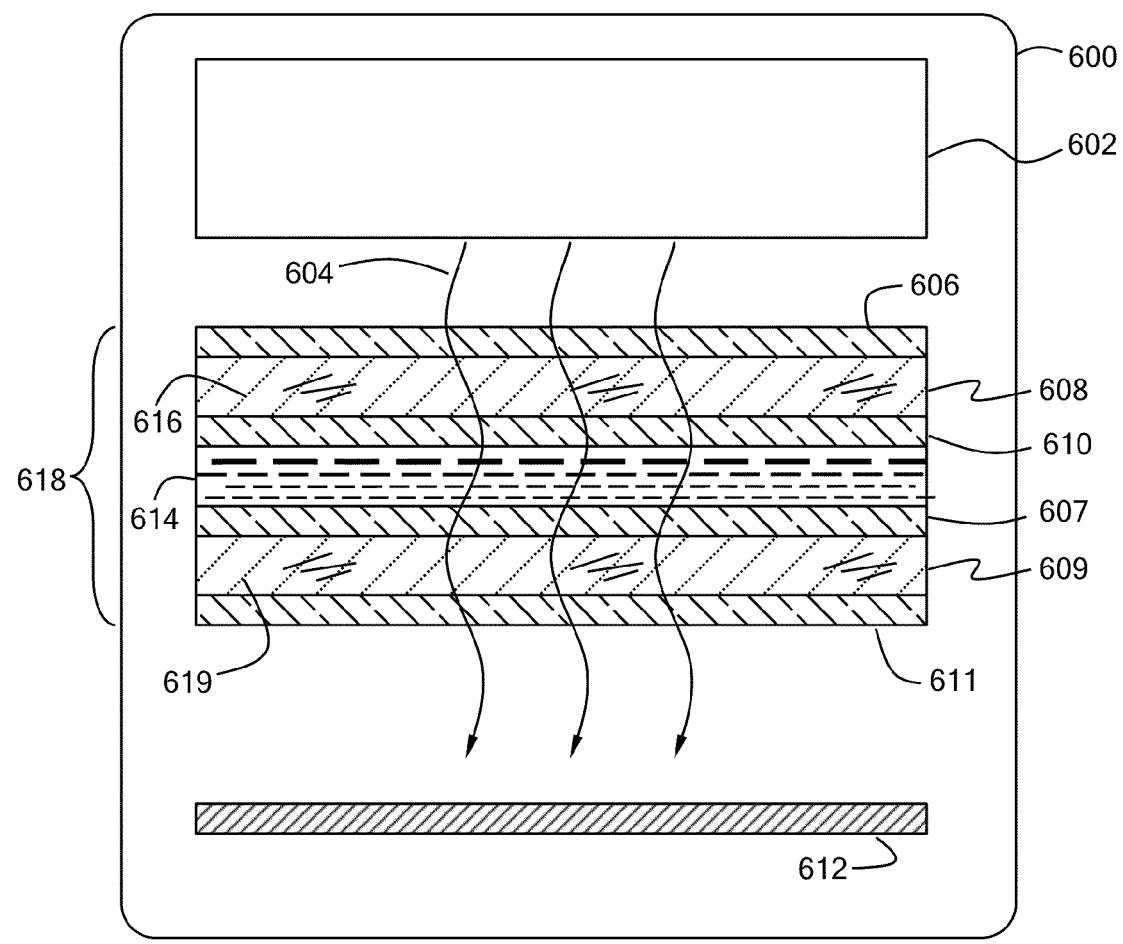
FIG. 6 is a schematic partial cross-sectional view of a processing chamber in accordance with one embodiment of the present invention.

In a further embodiment shown in FIG. 6, a window such as the window 20 of FIGS. 1 and 2 may be a composite window 618 comprising two window elements 608 and 609, which may be provided with a gap between the windows. The window is disposed between heat source 602 and substrate 612 that is heated by radiation through a radiation path illustrated by arrows 604. According to one or more embodiments, both window elements 608 and 609 in the composite window 618 are transparent to a broad range of radiation, except for a first wavelength band of radiation inside the broad range for which the window is absorptive. This can be achieved by doping a window with low levels of an absorber. The outside surfaces (where "inside" is defined as between the two windows) are coated with reflective coatings 606 and 611 which is reflective to substantially radiation in the first wavelength band of radiation. In alternative embodiments, the reflective coatings 606 and 611 may be applied to the inside surfaces instead of or in addition to being applied to the outside surfaces. In this embodiment, as the light passes through the first outside coating 606, it passes through the first window 608 of the composite window, a gap, the second window 609 of the composite window, reflect off of the second window's coating 611, pass back through the second window, the gap, and back through the first window again, etc. This configuration maximizes the number of times light would have to pass through a window (with absorber) per reflection—2 passes per one reflection—and in turn minimizes the amount of absorber that is needed. Accordingly, the gap between the windows 606 and 609 can be filled with a light absorbing fluid 614, which may be gas or liquid. The fluid 614 may also provide cooling of the composite window 618. If additional absorbance is desired absorber 616 may be doped in window 608 and/or absorber 619 can be doped in window 609. The fluid 614 may be provided into the gap by a system that may include a pump that pumps the liquid or gas through the gap. The system may also have a temperature control system that controls the temperature of the liquid or gas and thus may serve to control the temperature of the window. Absorbing material may be added to the gas or liquid to diminish the "hall of mirrors" effect. These absorbing materials can be a rare earth materials or any other suitable absorbing material.

In a further embodiment one may apply a composite window that contains at least two windows, wherein each side of each window is provided with a multi-layer dielectric reflective filter with a unique range of reflective wavelengths. In such a composite window, the total filter characteristic is then provided by the summation of up to four individual filter characteristics of each stack of dielectric layers. If a composite window comprises more than two individual windows, the total filter characteristic may be formed from individual filters, each created on a side of a window.

As yet a further embodiment of a composite window, comprising at least a first and a second window, a first outside window may be a transparent window. A second window with a reflective coating may be positioned between the process area and the first window. The first window may provide protection of chemical and/or mechanical wear of the second window and/or its coating.

It will be understood that in the figures, the heat source is positioned above the substrate and the pyrometer is placed below the heat source. Other configurations of the processing chamber are possible and are fully contemplated and within the scope of this invention. For instance, a processing chamber may have a heating source below a substrate and a pyrometer positioned above a heat source. These and other variations of positioning of substrate, heat source and pyrometer in a processing chamber are possible and contemplated without fundamentally affecting aspects of the inventions described herein.

In a further embodiment, a second wall 53, as shown in FIGS. 1 and 2, may comprise a window that is transparent to radiation instead of a metal wall. Such a second window is substantially transparent to heating radiation, which may be provided by a second lamphead which has a similar function as lamphead 24 in FIGS. 1 and 2. The second window is substantially parallel to a substrate, such as a wafer, and separates the process area from the second lamphead. Accordingly, in such a configuration the substrate such as a wafer can be heated from at least two sides. The second window in yet another embodiment may have a reflective layer, which may be in one of the configurations or embodiments of the first window. In an embodiment that includes two windows with two lampheads, thus exposing a substrate such as a wafer to radiation at two surfaces, the set-up of the pyrometer may also be modified. In a further embodiment, a pyrometer can be located in or on or behind a wall that is substantially perpendicular to a window with a reflective layer as was disclosed earlier. In that case the pyrometer is looking at a substrate such as a wafer from a side, rather than from above or below. In order to capture sufficient radiation from a substrate one can use several embodiments of positioning a pyrometer. In a further embodiment the pyrometer may be positioned in or behind an opening of a side wall located in a plane parallel to the substrate such as a wafer, the plane being higher or lower than the level of the substrate. This allows the pyrometer to look at the substrate under an angle, thus allowing capturing sufficient radiation from a surface of the substrate. In a further embodiment, a light pipe, such as a quartz tube, may be inserted through a hole in a side wall into the process area of the chamber. The hole being in a plane parallel to the substrate and the plane being above or below the plane of the substrate. A light pipe may be arranged in such a way that the end of the light pipe in the process area is parallel to a surface of the substrate. In another embodiment of the light pipe, the light pipe may be entering the process area parallel to a surface of the substrate such as a wafer. The light pipe can be provided with a bend at the side inside the process chamber so that it is substantially perpendicular to and above or below the surface of the substrate.

In yet a further embodiment, in embodiments having two windows with two lampheads or heating sources, both windows may be doped with an absorber and coated with a reflective coating. In yet a further embodiment of a chamber having two windows and two lampheads or heating sources, each window may be a composite window as described above.

As will be appreciated from the above discussion, a filter can be provided to prevent or minimize radiation within a predetermined range of wavelengths from reaching the pyrometer, providing more accurate measuring of the temperature of the substrate. As will become apparent from the description below, it may be desirable to provide a filter to prevent or minimize radiation within a predetermined range of wavelengths from reaching the wafer or substrate in the processing chamber. Thus a filter can be provided that prevents or minimizes certain bands of radiation from reaching the substrate or wafer. This radiation filtering can be performed separately from or in conjunction with filtering of light from the pyrometers as described above. When filtering light to prevent radiation of a certain bandwidth from reaching the substrate, better control of the substrate temperature can be achieved during heating of the wafer or substrate. Such control of the heating can be utilized to provide more predictable heating of the substrate particularly in relation to irradiated power of the heat source, which in specific embodiments are resistive lamps such as tungsten halogen lamps. It is highly desirable to provide a predictable relationship between the irradiated power of the heat source and the actual temperature of the wafer. Such a relationship can be provided by filtering predetermined bandwidths of radiation from reaching the substrate or wafer. Further control of heating can be provided by modifying the power supplied to the lamps. By both modeling and empirical data, optimal lamp power and filter characteristics can be obtained to provide optimized control of the heating profile of substrates. In another embodiment, the cool down rate of substrates can be better controlled by providing a filter that prevents or minimizes radiation within a predetermined wavelength range from reaching the substrate after power to the heat source has been turned off. In particular embodiments, the predetermined wavelength range coincides with or overlaps with the bandgap range of the substrate material. Such filtering during cooling is useful in spike heating processes where rapid heating and cool down of the substrates are desired. It will be appreciated that the concepts of providing a filter to prevent radiation from reaching the pyrometer, providing a filter to prevent radiation from reaching the substrate during heating of the substrate when the lamps are turned on and providing a filter to prevent radiation from reaching the substrate after the lamp power has been turned off can be practiced separately, or two or more of these filtering methods or systems can be practiced together.

In a RTP chamber, lamps in lamphead 24 as shown in FIG. 1 heat a wafer that may be surrounded by liquid cooled chamber walls. The radiance energy emitted by the lamps is transmitted to the wafer 12 through the quartz window 20 as shown in FIG. 1 which lies between the lamphead 24 and the wafer 12. In thermal spike processes such as spike annealing, where wafer temperature is ramped up very quickly to a target temperature and then ramped down very quickly (to form a thermal spike), a sharp spike is often desired. Device performance relies on the wafers reaching the target temperature while spending the least amount of time (dwell time) at or near the target temperature. This temperature performance is required to reduce thermal budget, minimize the impact of defects during processing, prevent diffusion of species, and/or other physical phenomena which degrade device performance. Thus, to minimize the dwell time, it is desirable to achieve high heating and cooling rates, and any improvement in heating and cooling rate is desired during thermal processing.

For thermal spike processing, achieving accelerated cool down rates, especially at temperatures less than or about 500° C. without having to provide auxiliary cooling of the chamber walls or without moving the wafer closer to the chamber walls, is often costly, physically challenging, or requires a physical change to the chamber that a user of a processing chamber would be less likely to accept. Also, at higher temperatures, for instance at wafer temperatures greater than or about 600° C., heat flux is primarily dominated by radiation as opposed to conduction or convection fluxes which dominate at lower wafer temperatures.

Figure 8:
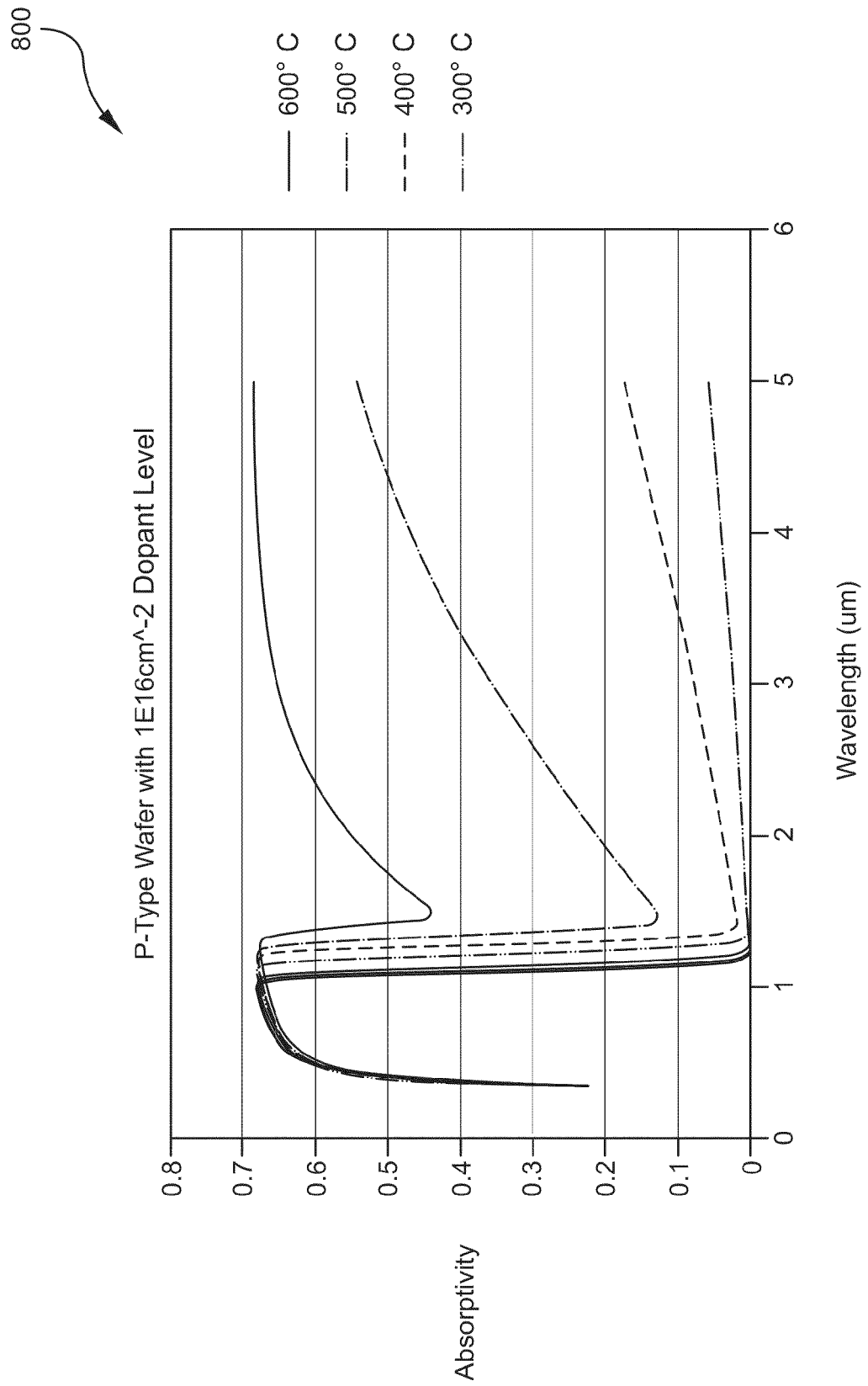
FIG. 8 shows a graph with radiation absorption curves versus wavelength.

In the chamber embodiment illustrated by FIG. 1, in a conventional rapid thermal processing chamber, a clear window 20 may be placed in between the lamps and the wafer, and light from the lamps at varying wavelengths, angles, and intensity passes through this window to heat the wafer. The emittance (and absorbance) of semiconductor silicon wafers varies greatly with wavelength and temperature. As an example, an intrinsic silicon wafer is transparent to radiation at wavelengths greater than 1.2 μm for temperatures less than 300° C. As the intrinsic silicon wafer heats up to temperatures greater than 300° C., it begins absorbing more radiation energy at wavelengths greater than 1.2 μm. This variability is true for intrinsic silicon wafers, doped wafers, silicon wafers containing films, nitrides, or oxides, or other wafer types, although each wafer type may have significant different emittance characteristics from one another. As the wafer heats up, the wavelength where most of the light energy is being absorbed, shifts to longer wavelengths. This is illustrated in FIG. 8 which shows in a graph 800 absorbance curves as a function of radiation wavelength for p-doped silicon for different temperatures of the wafer. Curves are shown for a wafer temperature of 300° C.; 400° C.; 500° C.; and for 600° C.

Figure 9:
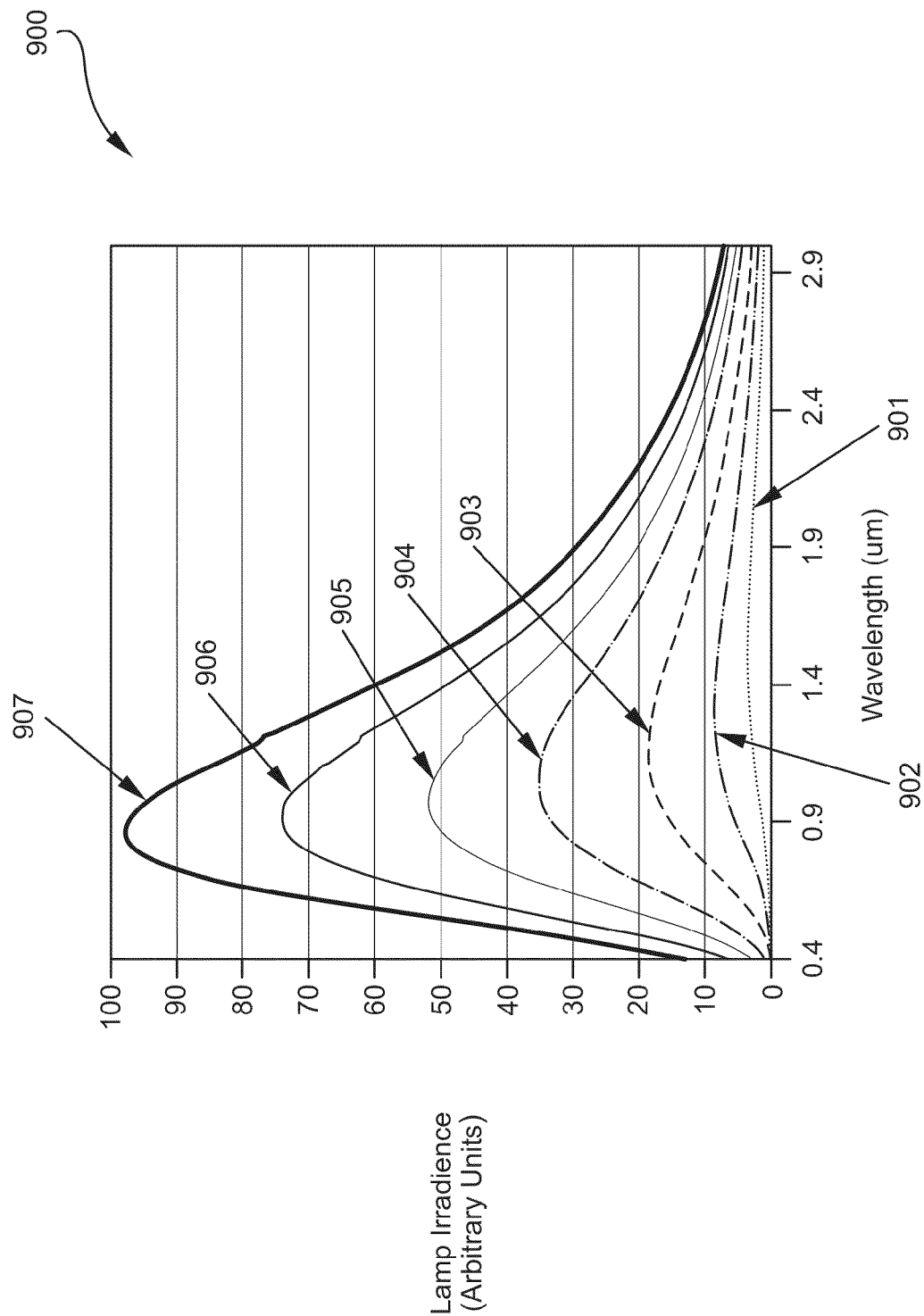
FIG. 9 shows a graph with radiation intensity curves versus wavelength.

Based on Wien's displacement law, as the lamps get hotter and hotter, the wavelength where peak emission occurs moves towards shorter and shorter wavelengths. Wavelength where peak emission occurs=2898 [m*K]/Temp [K]. This is illustrated in FIG. 9, which shows in a graph 900 a series of relative spectral emissive power curves which depend on the applied lamp voltage. There are 7 curves: 901; 902; 903; 904; 905; 906; and 907 at increasing applied voltage from curve 901 to curve 909, with curve 909 representing a lamp operating close to the upper design voltage for the lamp. The curves are typical of an incandescently heated lamphead. The lamps use a filament which is heated by an applied voltage. The higher the voltage, the higher the temperature of the filament. The curves 901, 902, 903, 904, 905, 906 and 907 illustrate Wien's displacement law and show that the wavelength at which peak radiation emission occurs shifts to lower wavelengths at higher lamp voltage and thus higher lamp temperature.

It is relatively difficult to closely control the heating and cooling of semiconductor substrates such as silicon wafers by radiation in a wavelength band of 1-1.3 micron. This applies in particular when heating to temperatures below about 600° C., below about 500° C. or below or about 400° C. Silicon, including doped silicon, readily absorbs radiation at temperatures below about 600° C., below about 500° C. or below or about 400° C., and within the wavelength range of about 1 to about 1.3 microns (1000 nm to about 1300 nm), which may dominate the wafer heating and adversely affect cooling as the wafer will continue to absorb radiation from the heat source when the heat source is turned off. In one embodiment, when a substrate such as a silicon wafer is heated with radiation, for example, by resistive lamps including bulbs producing radiation in a certain band of wavelengths in a chamber as illustrated by FIG. 1, heating within a predetermined band or range of wavelengths can be avoided or at least be reduced by providing a filter between the substrate and the heating lamps, wherein the filter blocks or reduces at least a portion of the radiation generated by the lamphead in the range of about 1-1.3 micron wavelengths or at least substantially prevents such radiation from reaching the substrate. By blocking or substantially reducing heating within the predetermined wavelength range at which the substrate absorbs energy within a predetermined temperature range, more linear type of temperature control $\Delta T/\Delta P$ can be maintained during rapid heating of the substrate wherein $\Delta T$ is a change in temperature of the substrate and $\Delta P$ is a change in lamp power, when radiation with a wavelength corresponding to the predetermined wavelength range is filtered out and does not reach the wafer. In one embodiment, filtering can be achieved by utilizing a coating on the window 20 a filter coating as discussed above, so that the coated window blocks a significant amount of radiation in an undesired bandwidth, for instance in a wavelength band of 1-1.3 micron from transmitting through the window and from reaching the substrate. Thus, the reflective window functions as a filter, and as used herein, the term filter refers to blocking at least a portion of radiation within a predetermined wavelength range. A filter may be a reflective filter or an absorbing filter. A reflective filter can be provided by depositing a stack of dielectric layers on the surface of the quartz window, as discussed above. The filtering characteristics are again defined by the applied materials of the dielectric layers, the number of layers and their thickness. Once the range of wavelengths to be blocked during a process has been determined, which will depend on the temperature range of the process, the composition of the substrate and radiation produced by the lamps, a filter can be designed and manufactured to block the predetermined range of wavelengths. Such a filter can be obtained from a variety of companies, one being JDS Uniphase of Milpitas, Calif. It will be appreciated that the same principle of designing filter can be used to design and provide a filter that blocks undesirable radiation from reaching the substrate after power to the heating source has been turned off.

Figure 10:
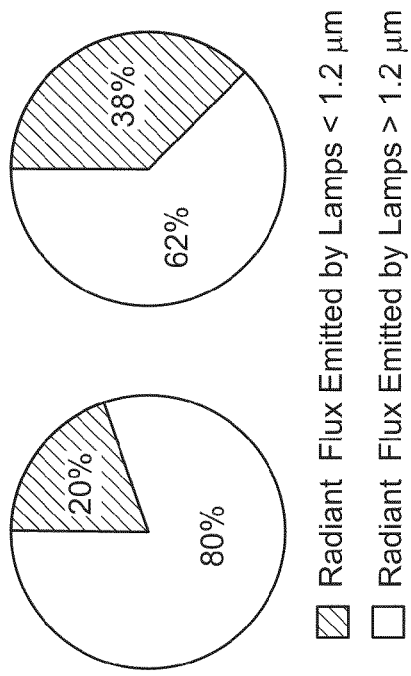
FIG. 10 illustrates distribution of lamp radiation over certain wavelengths.
Figure 11:
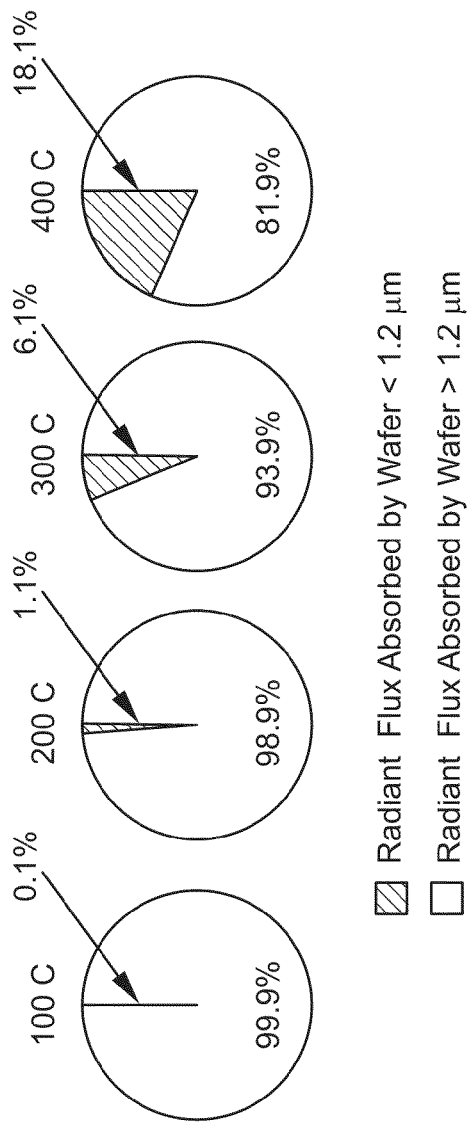
FIG. 11 illustrates absorption of radiation by a substrate over certain wavelengths.

FIG. 10 illustrates graphically in graph 1000 an example of a distribution of radiation energy as generated by a lamphead of wavelengths greater than 1.2 micron and wavelengths smaller than 1.2 micron, depending on lamp voltage. FIG. 11 graphically illustrates in graph 1100 an example of the absorption of radiation greater than 1.2 micron and smaller than 1.2 micron by silicon dependent on the temperature of the silicon. As seen in FIG. 11, clearly over half of the radiation generated by a lamp at operational voltages of about 40% of maximum voltage or lower is radiation with a wavelength greater than 1.2 micron. The heating of silicon at temperatures about or below 400° C. takes place by radiation at a wavelength smaller than 1.2 microns. At low temperatures (400° C. or lower) and lower lamp voltages (40% or lower) a substantial part of the energy radiated by the lamphead is not absorbed by the substrate to heat the substrate.

It would be desirable to further limit the wavelength of absorbed radiation by the substrate or wafer to below the limit of 1 micron as determined by the intrinsic absorption bandgap of the substrate material, to prevent issues with temperature control. This can be achieved by using a reflective or absorptive filter that reflects light above a wavelength λ1 and below λ2 and thus forms a notch or blocking filter as was provided before.

Figure 12:
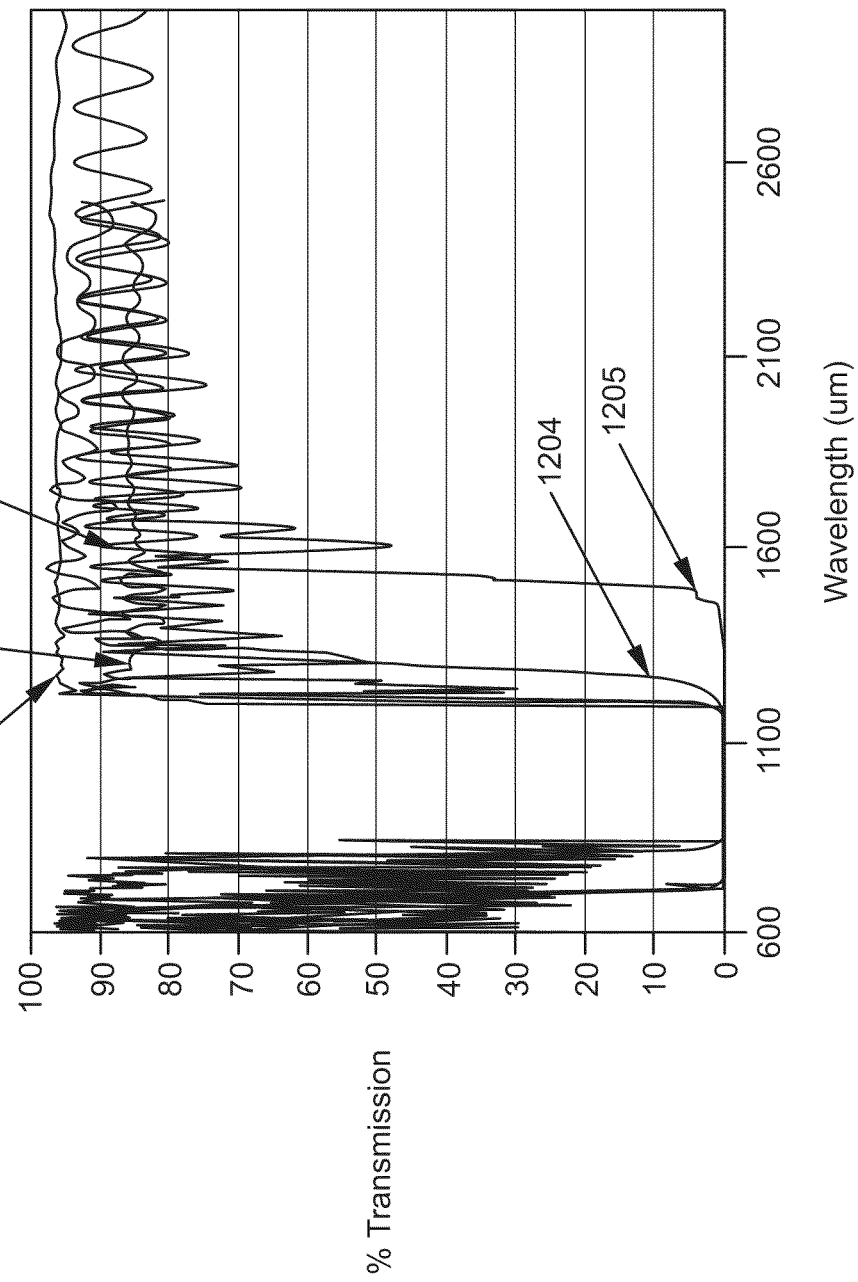
FIG. 12 illustrates filter transmission characteristics for various coatings in accordance with embodiments of the invention.
Figure 13A:
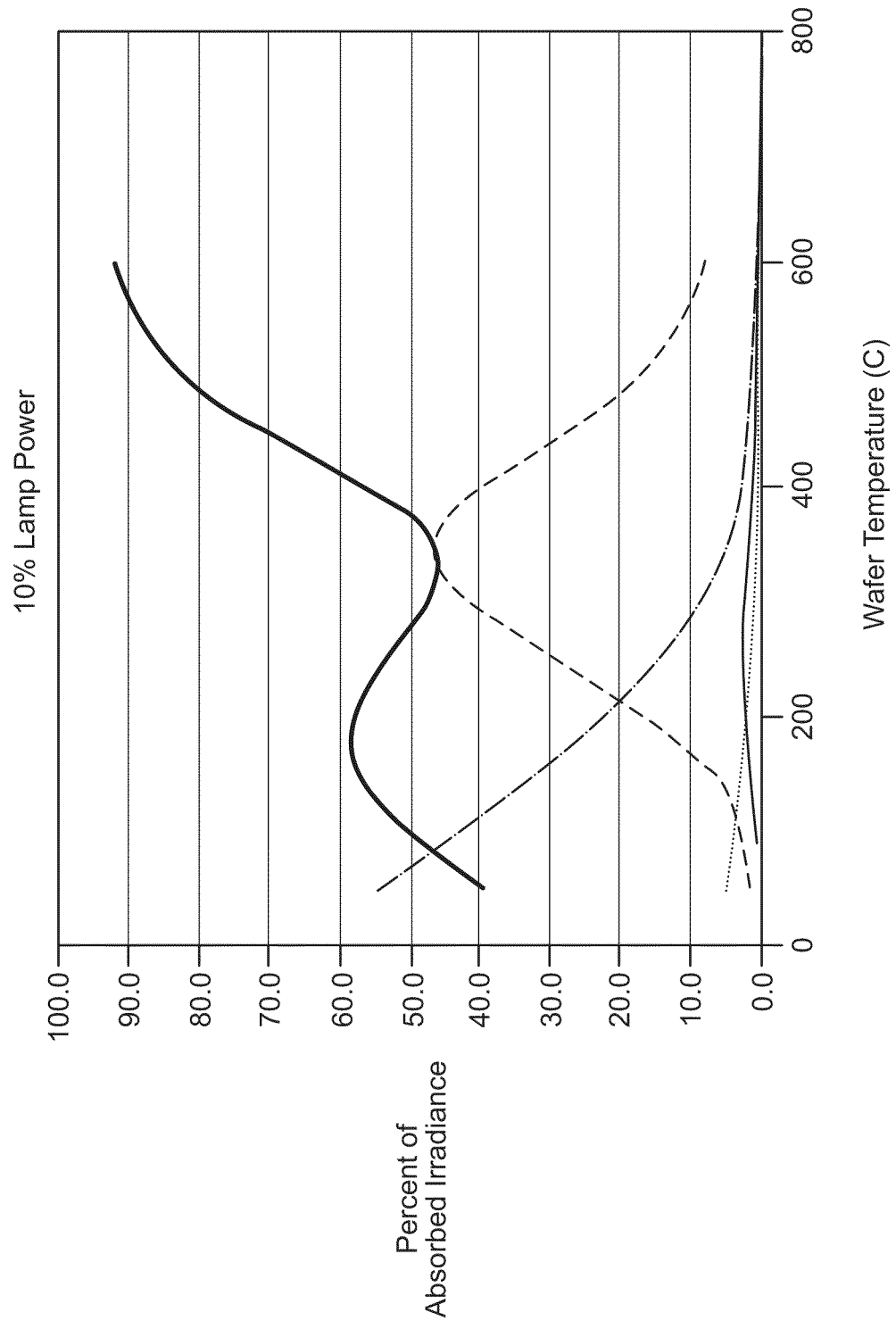
FIGS. 13A-D illustrate distribution of radiation absorbance by a substrate as a function of source power, temperature and wavelengths by applying a first filter coating in accordance with embodiments of the invention.
Figure 13B:
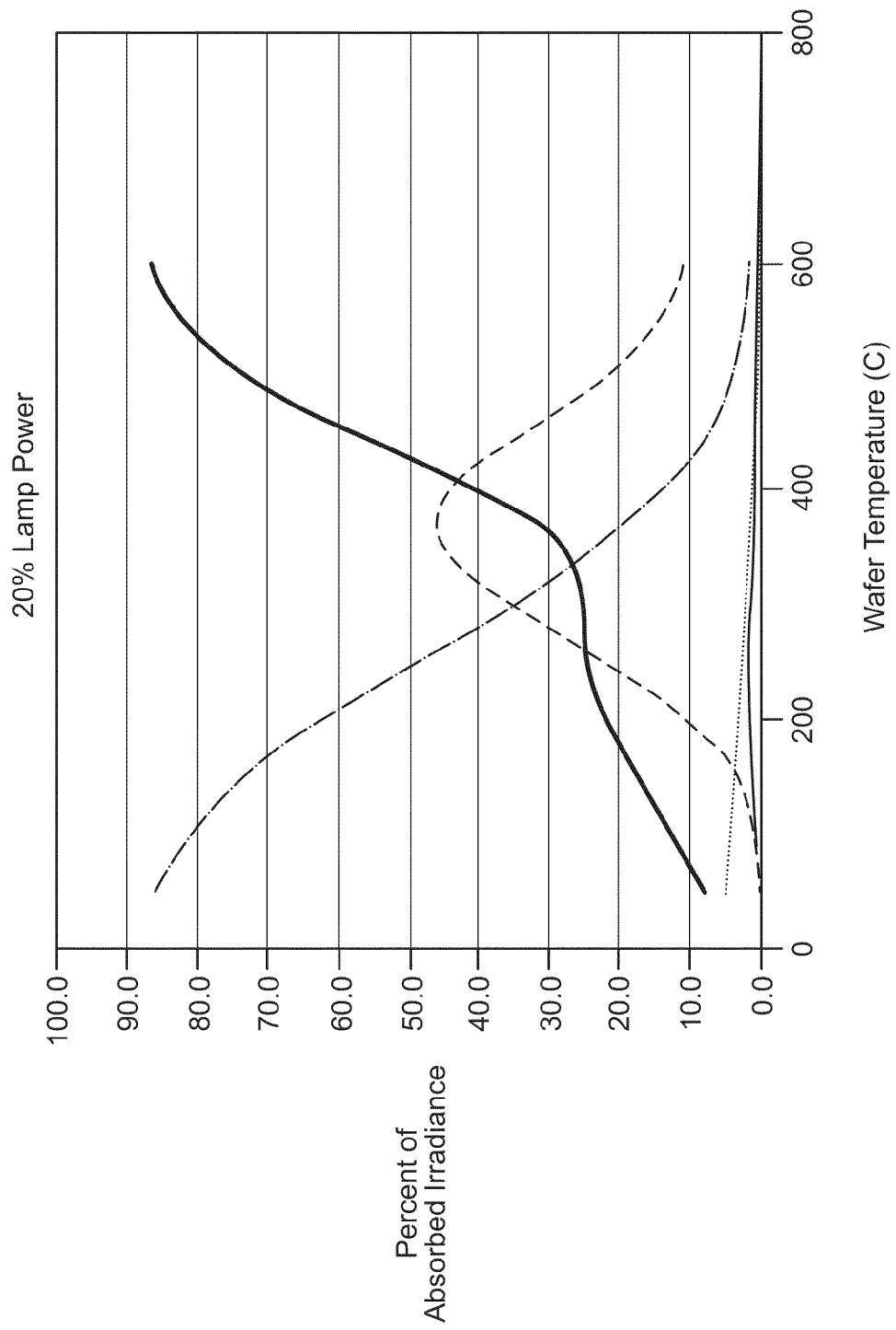
Figure 13C:
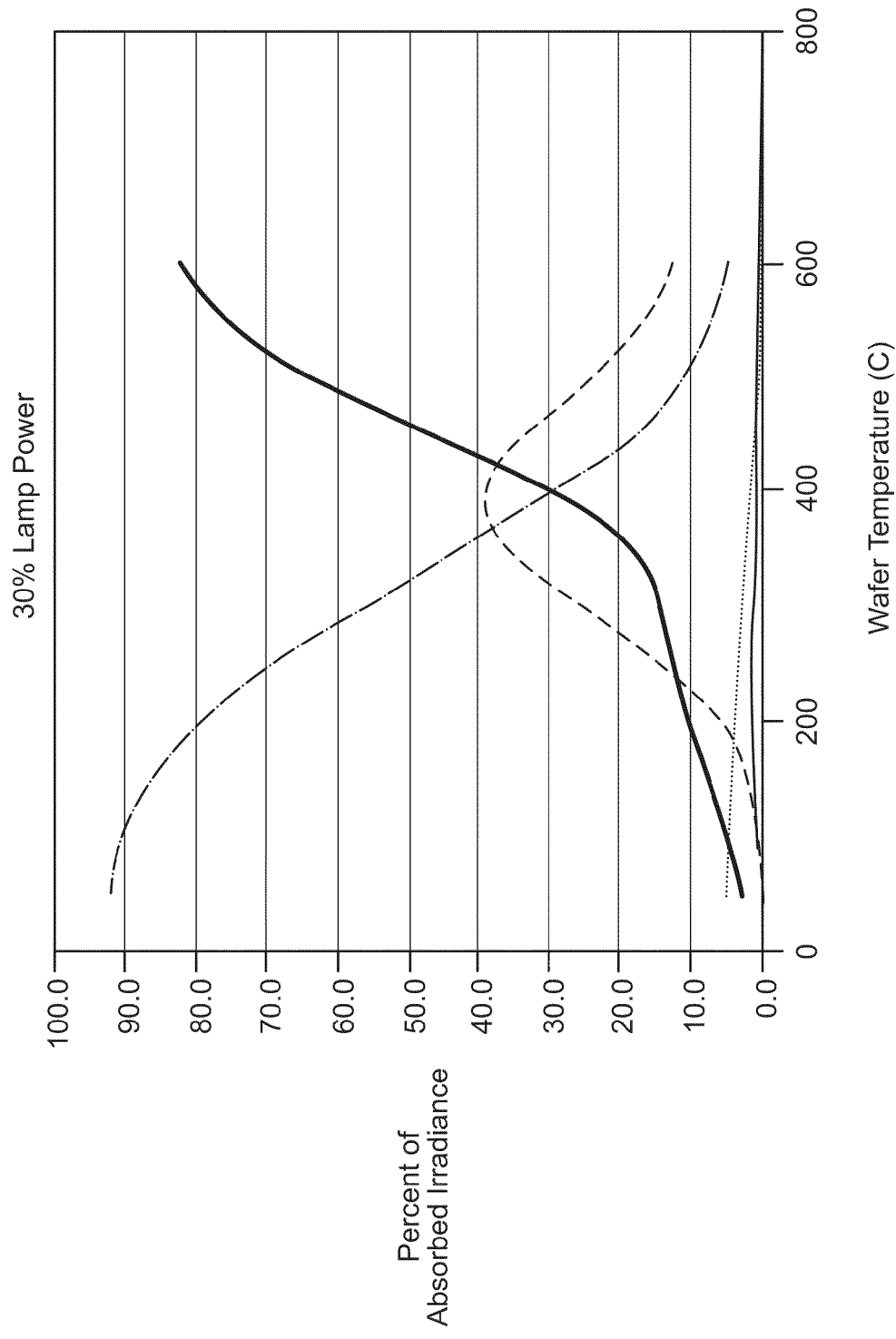
Figure 13D:
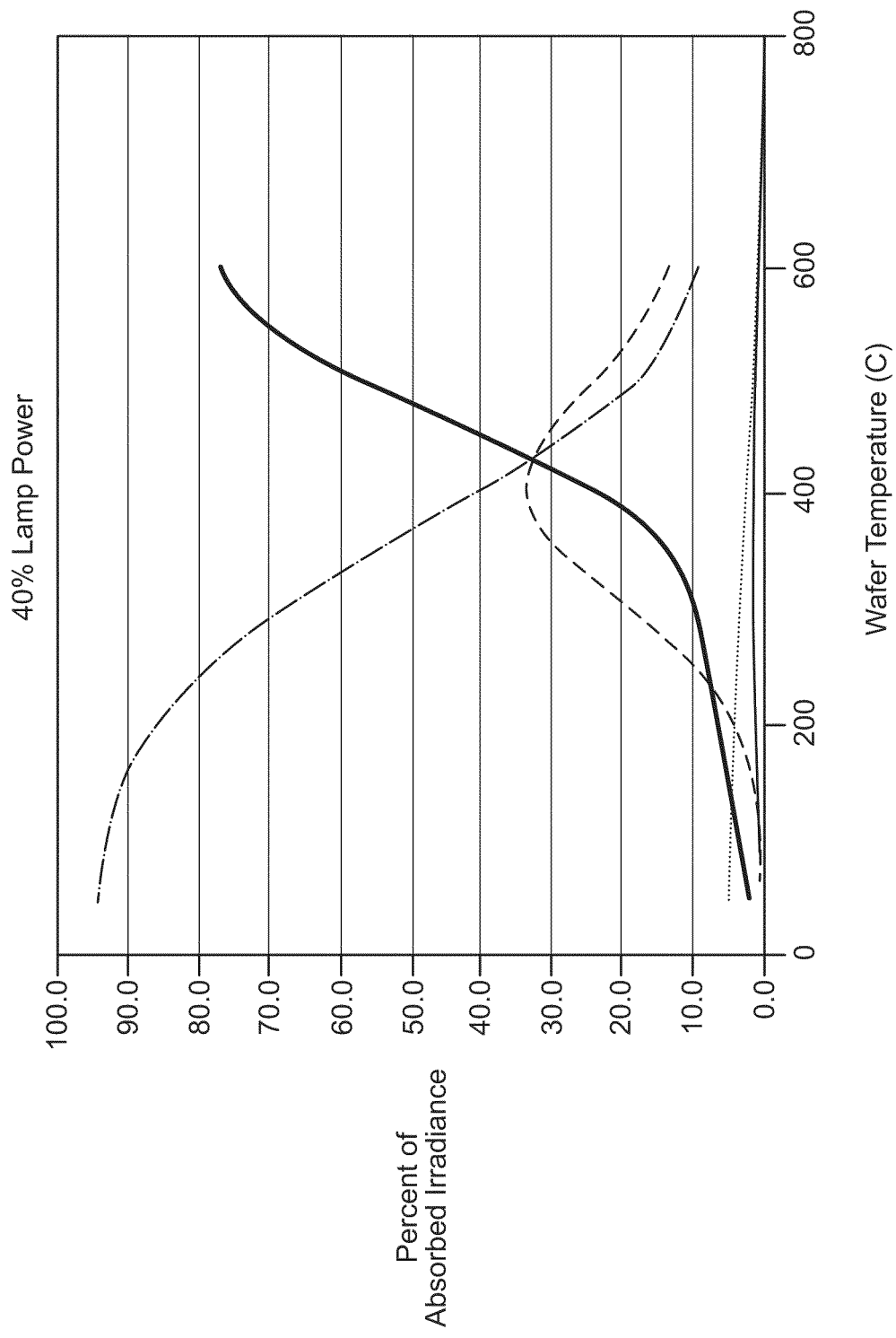

FIG. 12 shows the transmission curves 1201, 1202, 1203, 1204 and 1205 of 5 different reflective filters according to exemplary embodiments. FIG. 12 shows that all filters at least stop radiation in the band of 900 nm to 1100 nm. Compared to a window that does not block or absorb radiation within a predetermined wavelength range, the windows shown in FIG. 12, when placed between the heat source and the substrate, permit only a limited amount of radiation to reach the wafer. That radiation is in a limited range of wavelengths, compared to using a window that is transparent across the entire wavelength range of the heat source. To deliver the same amount of heat as compared to when using a so-called transparent window, the lamps have to use a greater lamp voltage when a window designed to block radiation within the predetermined wavelength range is placed between the substrate and the heat source.

Still referring to FIG. 12, in one experiment, a window 20 coated with filter coating 1203 was used. This coating filters out a significant part of radiation between 700 and 1200 nm and thus filters partially radiation in the band of 1-1.3 micron. By disposing this filter between the lamps of an RTP chamber and a substrate, the heating process becomes more linear, allowing for a better control of heating and faster heating control by a controller. The controller can benefit from the more linear process by a setting that allows it to react faster. This can be achieved by resetting one or more pre-set parameters of the lamp controller such as the amount voltage or duration of the voltage applied to a resistive heating lamp. Such pre-set parameters can be implemented through a processor that controls the heating profile of the lamps. In one embodiment, the processor is operative to control quantity of energy and time interval of energy supplied to the lamps to generate a predetermined maximum heating element temperature to provide an optimized cool down profile for the lamp to reduce thermal exposure of a substrate in the chamber. For a system or apparatus that includes resistive lamps such as tungsten-halogen lamps, the processor controls the amount of voltage and time of the voltage applied to the lamps so that the heating element, which is a lamp filament, reaches a maximum predetermined temperature. The maximum predetermined temperature is an optimized temperature determined from calculations and/or empirical study and is a temperature that provides an optimized cool down profile, which in turn minimizes thermal exposure of substrate to radiation during cool down of the lamps. Thus, it will be recognized that once such a maximum predetermined heating element temperature has been determined, the cooling rate of the heating element and the heat generated by the heating element during cooling produces less radiation that reaches the substrate and interferes with optimal cooling of the substrate.

For instance, because of the better linear performance, the gain of the controller can be increased. Because the system is more linear, with a higher gain the controller, which may be a PID controller or other suitable controller, can now control the system to more quickly reach a target set-point. In the more non-linear situation, using a window without a reflective or absorptive filter, a controller with a higher gain would create a more unstable system, either with more overshoot of the target or truly unstable and would certainly not reach a target set-point in a shorter time. Further experimentation shows that the performance and controllability of the chamber further improves as one uses a filter with a higher cut-off wavelength λ2. Filter coating 1203 gives for instance a better performance than 1202.

For instance, the coated window may be provided as part of a kit to improve the low temperature performance of a chamber. A user may switch an existing "transparent" window that is not designed to block radiation within a predetermined wavelength range, with the filter which is a window having a reflective coating and/or absorber. The exchange of the transparent window with a filter window can be combined with a change in controller settings, which may include an increase in the gain setting of the lamp controller. A user of a thermal processing apparatus may manually set a lamp controller gain or, alternatively, select from a menu a setting that provides a suitable gain that works in cooperation with the filter window to achieve an optimal heating profile. The menu can be provided as of controller that may include a processor and a user interface to select the appropriate parameters for a particular window. Such a user interface can be a programmable logic controller including a processor operable to adjust the gain and other control parameters of the lamp such as the quantity and/or duration of the voltage applied to lamp. Other methods to change a setting of a controller in accordance with a filter characteristic of a new window may also be utilized.

Accordingly, a processing chamber is provided for processing a semiconductor substrate in a defined or predetermined temperature range using a filter between a radiating heating source and the substrate, in which the semiconductor substrate has an energy band gap which causes the substrate to absorb radiation in a band of wavelengths between $\lambda_{low}$ and $\lambda_{high}$, and wherein the filter prevents at least part of the radiation in the band between $\lambda_{low}$ and $\lambda_{high}$ of the radiating source from reaching the substrate, thus improving the linearity and/or the speed to reach a target set-point of a controller or a control system that controls the temperature behavior of the substrate. In one embodiment, the substrate is a silicon substrate. In a further embodiment, the substrate is a doped silicon substrate. In yet a further embodiment, the substrate is a p-doped silicon substrate. In yet a further embodiment, the band between $\lambda_{low}$ and $\lambda_{high}$ is between 1-1.3 micron. In yet a further embodiment, the defined temperature range is between room temperature and 600° C. In yet a further embodiment, the defined temperature range is between room temperature and 500° C. In yet a further embodiment, the defined temperature range is between room temperature and 400° C. In yet a further embodiment the defined temperature range is lower than 400° C. In yet a further embodiment the use of the filter is combined with an adjustment of the controller to achieve a faster response time in reaching a target temperature. In yet a further embodiment the controller is a PID controller. In yet a further embodiment the adjustment of the controller is an increase of the gain.

The effects of the filter coatings as shown in FIG. 12 are further illustrated in FIG. 13 for the filter characterized by curve 1203 and in FIG. 14 for the filter characterized by curve 1205. FIGS. 13A-D and 14A-D show the effect of increased lamp voltage. As the voltage of the lamp increases, the lamp gets hotter and starts to radiate more in lower wavelengths. For instance, as seen in FIGS. 13A-D, when a filter with a reflective band or wavelength range between about 0.7-1.2 micron is used, the wafer experiences almost no contribution in heating from radiation in that waveband, because it is filtered out. At temperatures below 400° C. the contribution of radiation in 0.4-0.7 micron dominates the heating process.

Figure 14A:
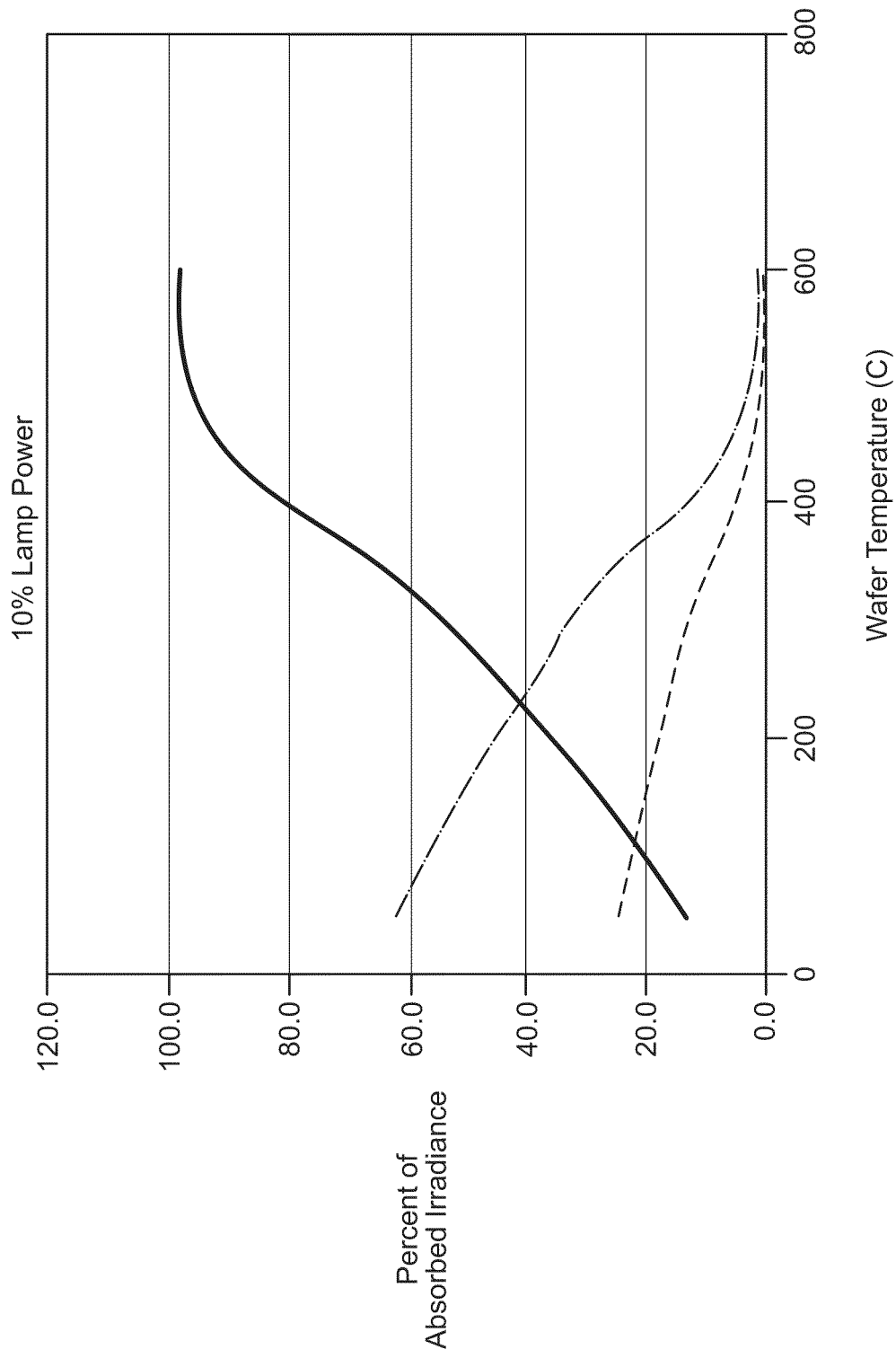
FIGS. 14A-D illustrate distribution of radiation absorbance by a substrate as a function of source power, temperature and wavelengths by applying a second filter coating in accordance with embodiments of the invention.
Figure 14B:
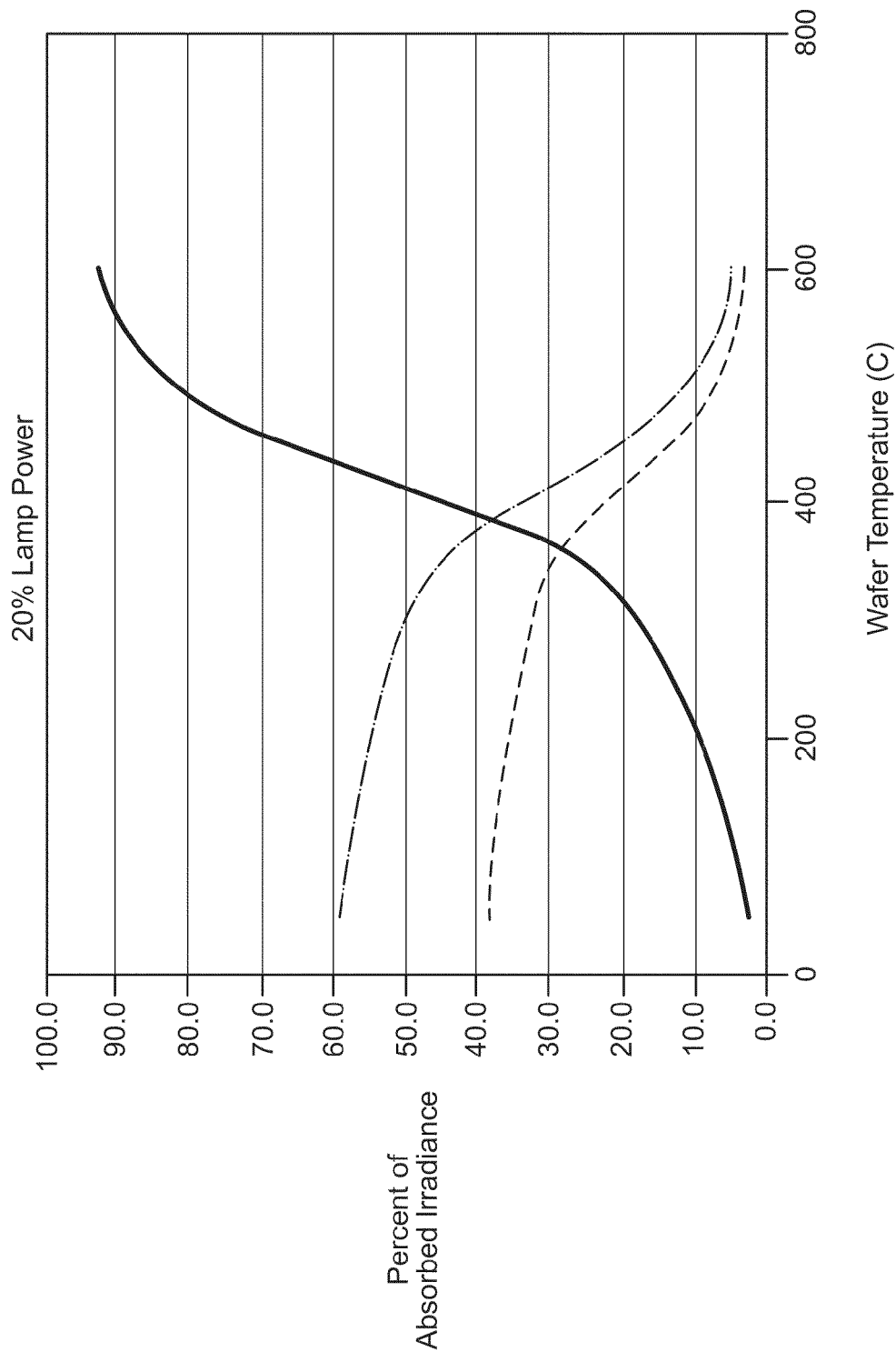
Figure 14C:
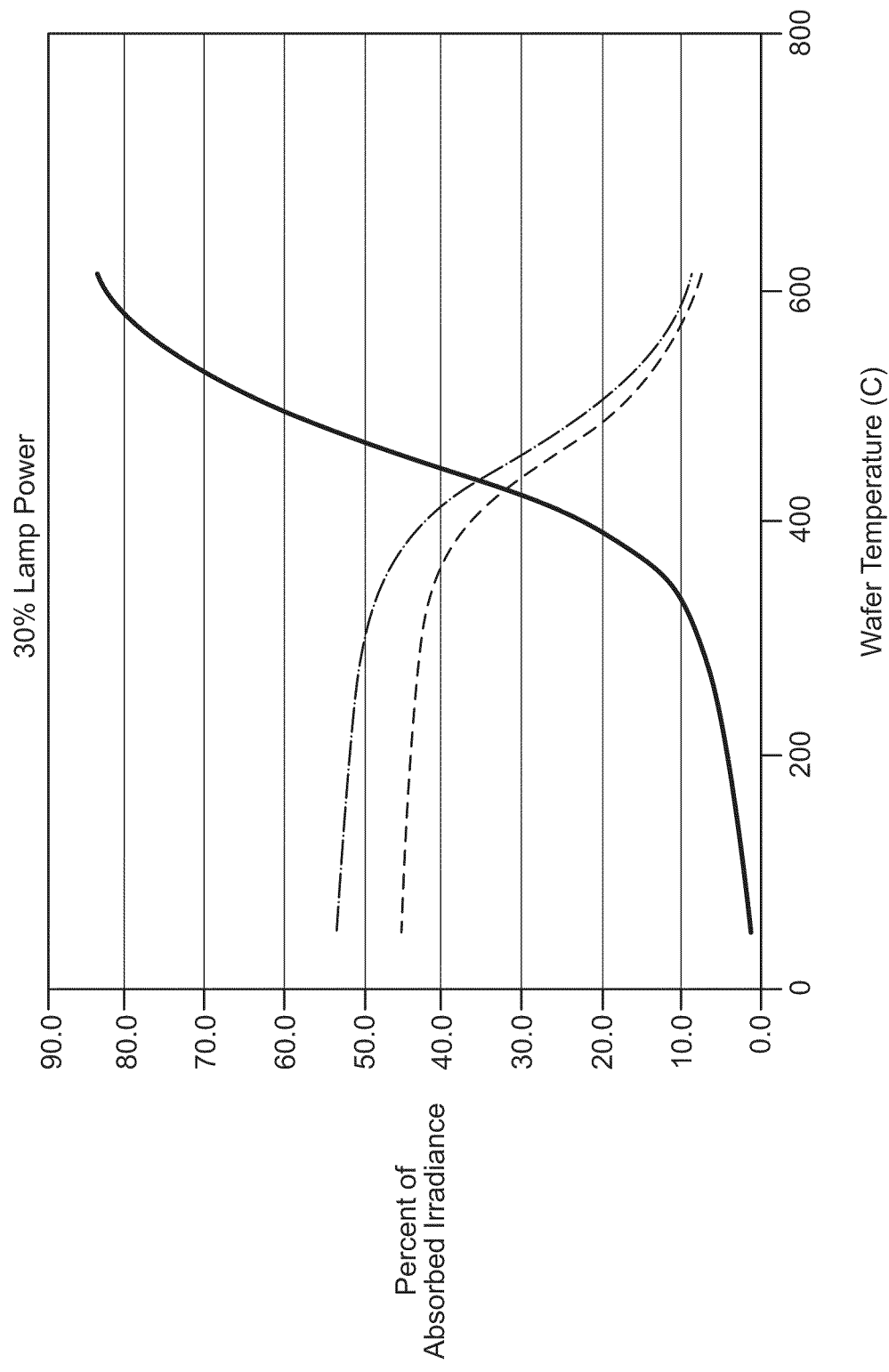
Figure 14D:
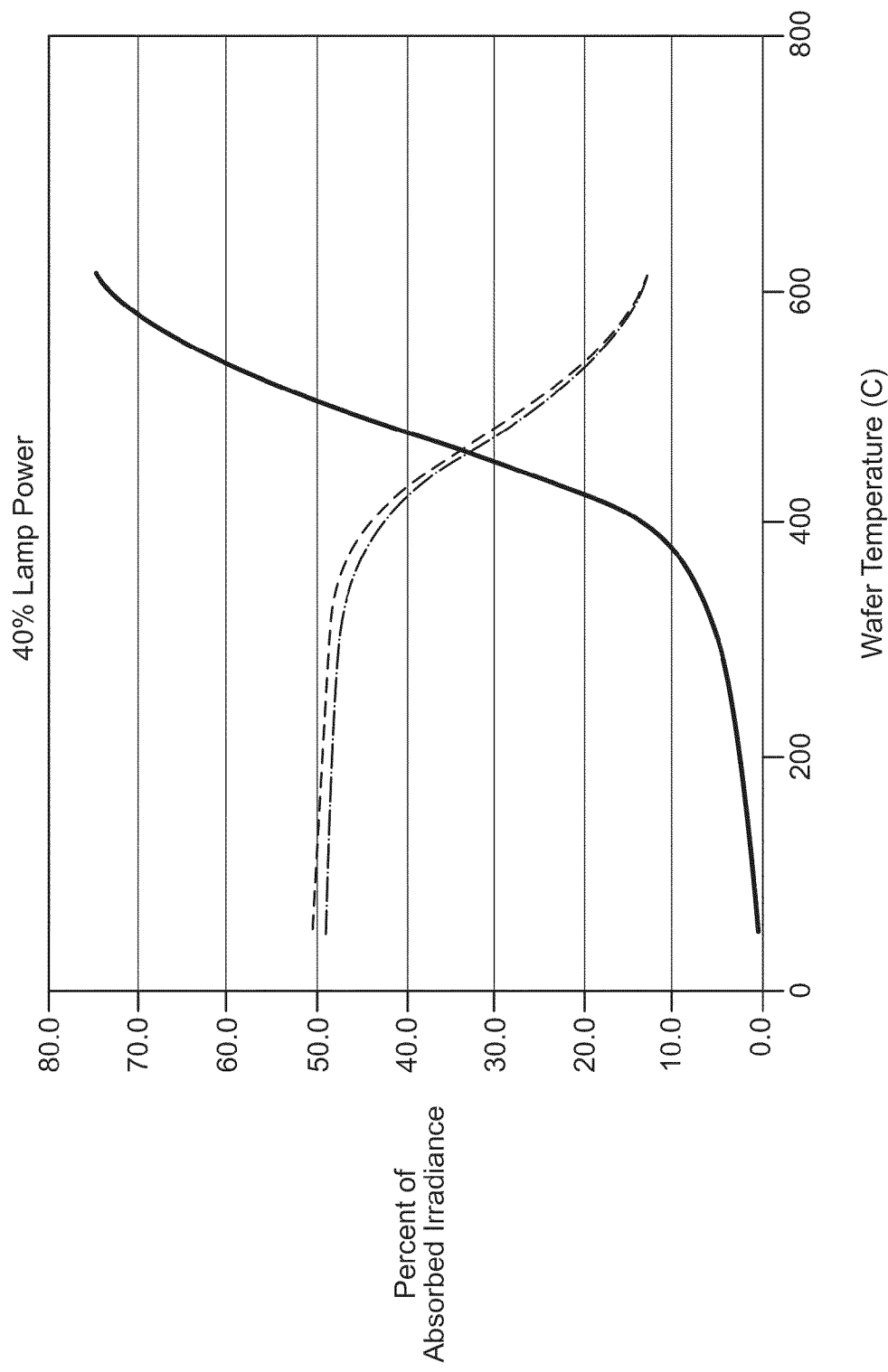

FIGS. 14A-C demonstrate the effects of increasing the filter bandwidth by about 0.15 microns compared to the filter of FIGS. 13A-D. Radiation in the 0.7-1 micron range now contributes significantly and that radiation in the 1.21-1.33 micron range is almost completely filtered out. This is consistent with an improved linearity of the heating process by filtering out additional radiation in the 1-1.3 micron wavelength range.

As will be appreciated by the above discussion, spectral or notch filtering can be used to improve predictability or linearity of the heating profile of substrate in a thermal processing chamber with respect to the power applied to the lamps. The same principle of filtering wavelengths within a predetermined wavelength range can be used to improve the cooling profile of the substrate after the power to the heating source has been turned off. It will be appreciated that filtering during cool down when the lamp power off can be performed separately from or together with filtering during heating to improve linearity or predictability of heating during heating. When both types of control are desired (during heating and during cooling), separate filters may be utilized, or a single filter having the predetermined wavelength range or ranges for blocking may be utilized. Radiation blocking during cooling can be useful during spike thermal processing. During a spike thermal process in a processing chamber, the lamps heat up quickly to ramp up the wafer temperature, but even if voltage to the lamps is turned to 0 immediately, the lamps still take some time to cool down and are still radiating to the wafer while they are cooling down. If the wafer is still absorbing radiated energy from the cooling lamps, then the cool down rate of the wafer will not be as fast as if the wafer was not absorbing energy from cooling lamps.

One way to reduce the amount of energy that the wafer continues to receive from cooling lamps is to place an optical filter (for example, a reflective coating on the window, or an absorbing dopant in the window material itself) between the lamps and the wafer which blocks longer wavelength of light (for example, wavelengths shorter than the absorption band edge for the substrate material) from reaching the wafer. Because the window blocks a significant amount of radiation from reaching the wafer, the lamps will need to run at higher voltages to reach the same heat-up rates (which means peak emission occurs at shorter wavelengths). When the lamps are shut off, the lamp cools down and the peak emission of the cooling lamps will begin moving towards longer wavelengths, and as the peak emission wavelength crosses the optical filter edge (e.g. 1.2 micron for a silicon substrate), the wafer will no longer "see" the radiated energy of the cooling lamps and the wafer will cool down faster. If a filter is designed to block light >0.9 micron, even higher voltages will be required to achieve the same heat up rates and an even faster wafer cool down rate will occur as the peak emittance of the cooling lamps crosses the 0.9 micron wavelength sooner than it crosses 1.2 micron. This is demonstrated in FIG. 9 in the different curves. A further effect is to reach the same level of irradiated power, the lamps will need to operate at higher temperatures in the filtered case as compared to the unfiltered case. Since irradiated power (P) is related to filament temperatures (T) as $P(T)=T^4$, and since filament temperature cooling rates (T') are greater at higher filament temperatures T, then the rate of irradiated power decrease (P') is significantly greater for lamp filaments which start cooling at higher temperatures.

Higher operating temperatures are required for a lamp that operates in a processing chamber with a filter. In order for the power of the filtered source of radiation that reaches the substrate to match the power of the unfiltered source of radiation the operating power of the source (the lamp) will be significantly higher than for the unfiltered source and the lamp will reach a significantly higher temperature. For instance a simple power model shows that when radiation in a 750-1200 nm wavelength band is removed by a filter on a window in a processing chamber as was discussed above, the filtered source (the lamp working in combination with the coated window in the chamber) may have to operate at a temperature about 525 C higher to match the radiation power of the unfiltered source. It is known that the cool down rate of a body with a higher temperature to a certain temperature is faster than when that body has a lower temperature. One may thus influence the cooling down effect by raising the temperature of the source (the lamp) and filtering a substantial part of the radiation that will reach the substrate.

Thus, the optical filter can be tuned to specific processes and wafer temperatures for optimal performance. A full range of embodiments can be imagined where the window blocks wavelengths >0.7 micron through >2.0 micron. It may also be desirable to have the filter block and transmit multiple segments of the spectrum at varying intensities (i.e. 99.9% blocking for 0.75-1 micron and >80% blocking for >1.5 micron) to find the optimum balance between heating and cooling rates for a given wafer temperature and type. For example, if at 5% lamp voltage, too much irradiated power from the lamps is seen by the wafer to control at the desired temperature (200 C for example), then wafer temperature control at said temperature may be poor, impractical, or unachievable. By using the filter to block some of the power from the lamps, the target wafer temperature (for example 200 C) could be controlled with average lamp zones of 5%, or 10%, or higher depending on how much irradiance the filter blocks. Another benefit of this effect is, with the filter, the nominal voltage level required at the lamps to achieve the target temperature approaches the center point of the lamp driver's control range. For example, if the lamp driver's control range is 5%-100%, then the center of the control range is 52.5%. If the controller is trying to control temperature at a nominal voltage of 7%, then the controller only has a −2% low end range before becoming low saturated. However, if the nominal control voltage required to reach the same desired temperature can be increased to 10%, now the controller has a −5% low end range before reaching low saturation. For a controller with a 0-100% range, optimal nominal value is 50%.

The improved cooling effect by radiation may be demonstrated in an actual heating spike showing an improved cooling rate by radiation only by using a filter and no additional cooling apparatus. By using a filter window, the spike should also show an improved ramp-up for heating a wafer, due to the earlier described improved linearization by blocking radiation corresponding to the bandgap of the substrate material. For comparison, a standard heating spike provided is rather flat in appearance and there is a substantially flat roll off or decrease in temperature from the peak temperature. This is because of the lack of filtering by the window of wavelengths that contribute to continued heating of the substrate after the lamps have been turned off. A positive effect of using a notch or bandstop filter that blocks radiation within a predetermined wavelength is that such a system produces a rather sharp temperature enabling a faster ramp-up in temperature and a relatively fast cool-down compared to when the filter is not present. The improvement in heating and cooling are not only due to blocking radiation from the lamps from reaching the pyrometers in their operational wavelengths. Further improvement is also achieved by better controllability and more rapid cooldown by using the appropriate filters to prevent undesirable radiation from heating the substrate after the lamps are turned off. This is demonstrated by using different lower and upper cut-off wavelengths for the stopband of the filter. Better blocking radiation in the band of wavelengths corresponding to the bandgap of the substrate and additional blocking of radiation with a wavelength greater than the upper wavelength limit corresponding to the bandgap create both improved controllability and cooldown compared to filters that did not have such a characteristic.

Accordingly, a filter in the form of a window containing a reflective coating and/or absorber, which may be coated on a single side or on both sides, having filter characteristic that substantially prevents radiation of predetermined wavelengths from from reaching a substrate can be used. This improves controllability of the heating process of the substrate when the heat source is switched on and increases the cool down rate of a wafer after the heat source has been switched off.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. For example, while the embodiments described above were described to rapid thermal processing chambers, it will be understood that the principles of the present invention can be applied to a variety of thermal processing chambers and the present invention is not limited to rapid thermal processing. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An apparatus for heating a substrate within a predetermined temperature range, the substrate absorptive of radiation in a second range of wavelengths, the apparatus comprising:
   a heat source to provide radiation in a first range of wavelengths to perform said heating, the second range of wavelengths within the first range of wavelengths;
   a process area including a substrate support to support the substrate; and
   a filter disposed between the substrate support and the heat source to filter radiation from the heat source so that at least a portion of the radiation within the second range of wavelengths is not absorbed by the substrate, the filter comprising a coating to block light in the second range of wavelengths so that the light in the second range of wavelengths is not transmitted to the substrate.

2. The apparatus of claim 1, wherein the coating on the filter comprises a reflective coating to reflect radiation from the heat source to prevent at least a portion of the radiation within the second range of wavelengths from being transmitted to the substrate when the heating source is turned off after heating the substrate to a temperature of less than about 600° C. so that the substrate cooling occurs at a faster rate than when the radiation within the second range of wavelengths is not prevented from being absorbed by the substrate.

3. The apparatus of claim 2, wherein when the substrate to be processed comprises silicon, the second range of wavelengths has a lower limit greater than about 1000 nm.

4. The apparatus of claim 3, wherein the second range of wavelengths has a lower limit of about 1000 nm and an upper limit of about 1300 nm.

5. The apparatus of claim 4, wherein the second range of wavelengths has a lower limit of about 1000 nm and an upper limit of about 1200 nm.

6. The apparatus of claim 2, wherein the reflective coating blocks a preselected percentage of radiation within the second range of wavelengths and a different preselected percentage of radiation within a third range of wavelengths different from the second range of wavelengths.

7. The apparatus of claim 1, wherein the coating on the filter comprises a reflective coating that reflects radiation from the heat source within the second range of wavelengths and the second range of wavelengths is a predetermined range of wavelengths based on the substrate's absorbance as a function of temperature.

8. The apparatus of claim 7, wherein when the substrate comprises silicon, the second range of wavelengths has a lower limit that exceeds about 900 nm.

9. The apparatus of claim 1, wherein the heating source comprises lamps and the second range of wavelengths is selected based upon composition of the substrate and peak emission of the heating source as a function of applied energy to the lamps to provide improved predictability of heating of the substrate as a function of energy applied to the lamps.

10. The apparatus of claim 9, wherein the apparatus further comprises a processor to control quantity of energy and time interval of energy supplied to the lamps to generate a predetermined maximum heating element temperature to provide an optimized cool down profile for the lamp to reduce thermal exposure of a substrate in the process area.

11. The apparatus of claim 1, wherein the filter comprises an absorptive window to prevent at least a portion of the radiation within the second range of wavelengths from being transmitted to the substrate when the heating source is turned off after heating the substrate to a temperature of less than about 600° C.

* * * * *